(12) United States Patent
Hamamoto

(10) Patent No.: US 8,929,418 B2
(45) Date of Patent: Jan. 6, 2015

(54) SEMICONDUCTOR LASER

(71) Applicant: Kyushu University, National University Corporation, Fukuoka (JP)

(72) Inventor: Kiichi Hamamoto, Fukuoka (JP)

(73) Assignee: Kyushu University, National University Corporation, Fukuoka (JP)

( * ) Notice: Subject to any disclaimer, the term of this patent is extended or adjusted under 35 U.S.C. 154(b) by 0 days.

(21) Appl. No.: 14/026,174

(22) Filed: Sep. 13, 2013

(65) Prior Publication Data

US 2014/0133507 A1    May 15, 2014

Related U.S. Application Data

(63) Continuation of application No. PCT/JP2012/056590, filed on Mar. 14, 2012.

(30) Foreign Application Priority Data

Mar. 14, 2011    (JP) ................. 2011-055902

(51) Int. Cl.
*H01S 5/00*    (2006.01)
*H01S 5/20*    (2006.01)
*H01S 5/10*    (2006.01)
*H01S 5/227*    (2006.01)
*H01S 5/065*    (2006.01)

(52) U.S. Cl.
CPC .............. *H01S 5/2031* (2013.01); *H01S 5/101* (2013.01); *H01S 5/227* (2013.01); *H01S 5/1064* (2013.01); *H01S 5/0655* (2013.01); *H01S 2301/166* (2013.01); *H01S 5/1007* (2013.01)
USPC ................. 372/45.01; 372/43.01; 372/50.11; 372/50.1

(58) Field of Classification Search
USPC ........................ 372/45.01, 43.01, 50.11, 50.1
See application file for complete search history.

(56) References Cited

U.S. PATENT DOCUMENTS

2003/0147432 A1*    8/2003    Bukkems .................... 372/20
2003/0185256 A1*    10/2003    Aoki ............................ 372/20
(Continued)

FOREIGN PATENT DOCUMENTS

| JP | 11-068241 A | 3/1999 |
|----|-------------|--------|
| JP | 11-068242 A | 3/1999 |

(Continued)

OTHER PUBLICATIONS

"20-km Transmission of 40-Gb/s Signal Using Frequency Modulated DBR Laser," Kakitsuka, T. et al., Optical Society of America, 2009.

(Continued)

*Primary Examiner* — Kinam Park
(74) *Attorney, Agent, or Firm* — Dingman, McInnes & McLane, LLP

(57) ABSTRACT

A semiconductor laser is provided with one or more rear ports and one front port and with a multi-mode interference optical waveguide that has an active layer (light emitting layer) in all regions in plan view. The front port corresponds to an imaging point at which fundamental mode light forms an image in the active layer (light emitting layer) perpendicular to the waveguide direction of the multi-mode interference optical waveguide, and in plan view the front port is disposed along a central line, off center with respect to a central line, along the waveguide direction of the multi-mode interference optical waveguide.

22 Claims, 38 Drawing Sheets

(56) References Cited

U.S. PATENT DOCUMENTS

2006/0274802 A1* 12/2006 Aoki et al. .............. 372/45.01
2011/0149381 A1* 6/2011 Hatakeyama ............. 359/341.1

FOREIGN PATENT DOCUMENTS

| | | |
|---|---|---|
| JP | 2009-054699 A | 3/2009 |
| JP | 2009-206463 A | 9/2009 |
| WO | 92/11554 A2 | 7/1992 |
| WO | 2006/077641 A1 | 7/2006 |

OTHER PUBLICATIONS

"Low-Driving-Current High-Speed Direct Modulation up to 40 Gb/s Using 1.3-um Semi-Insulating Buried-Heterostructure AlGaInAs-MQW Distributed Reflector (DR) Lasers," Otsubo, K. et al., Optical Society of America, 2009.

* cited by examiner

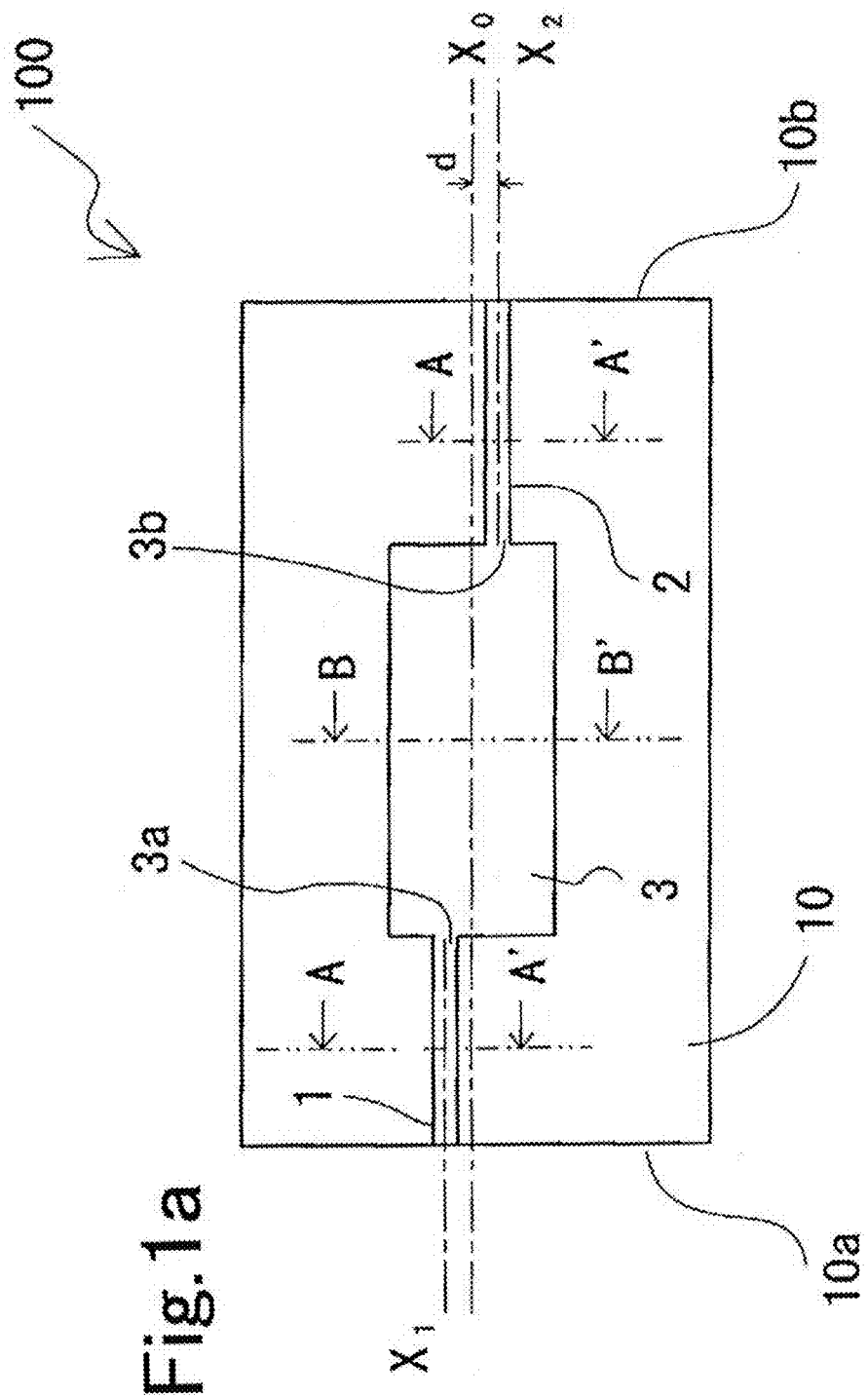

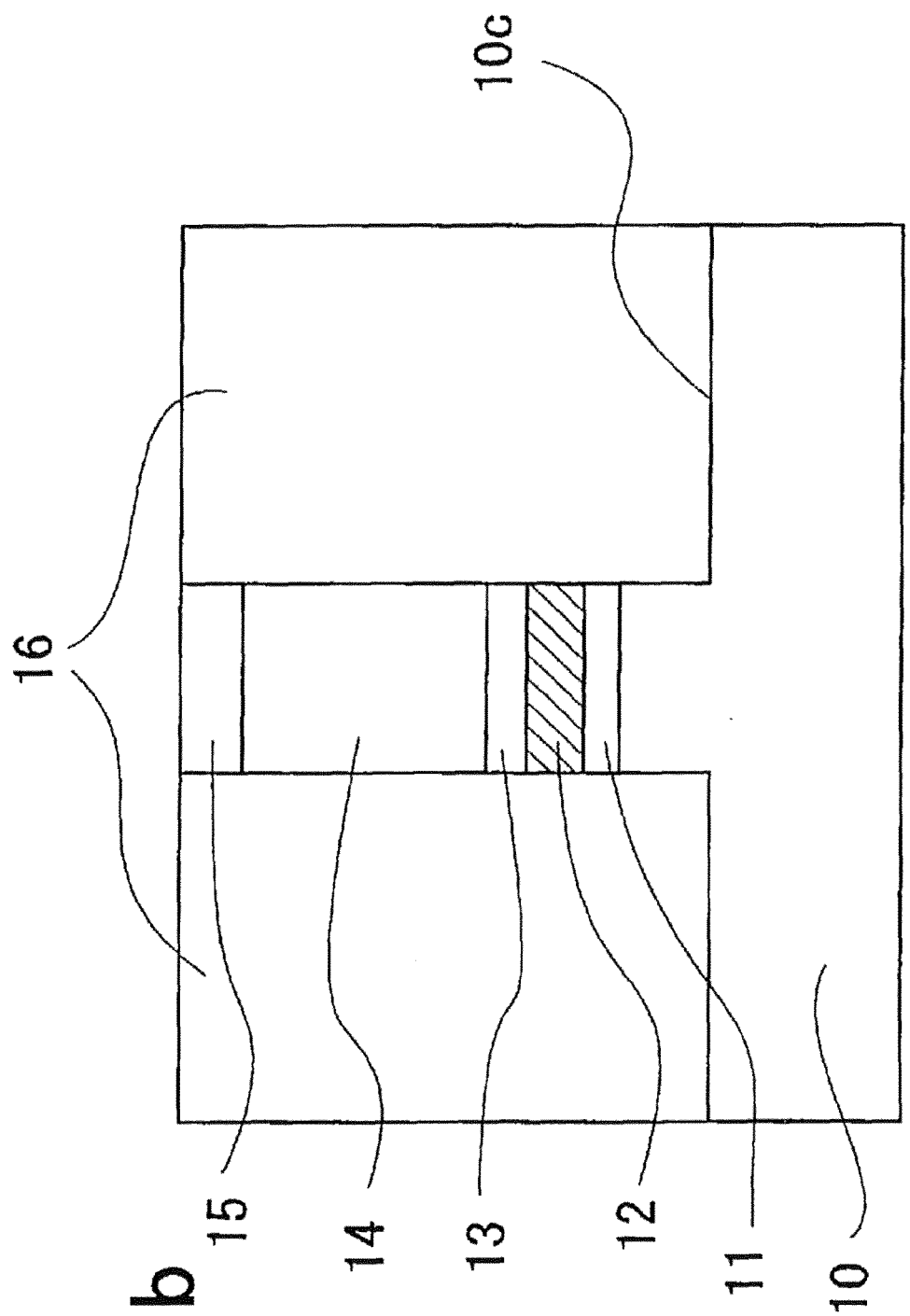

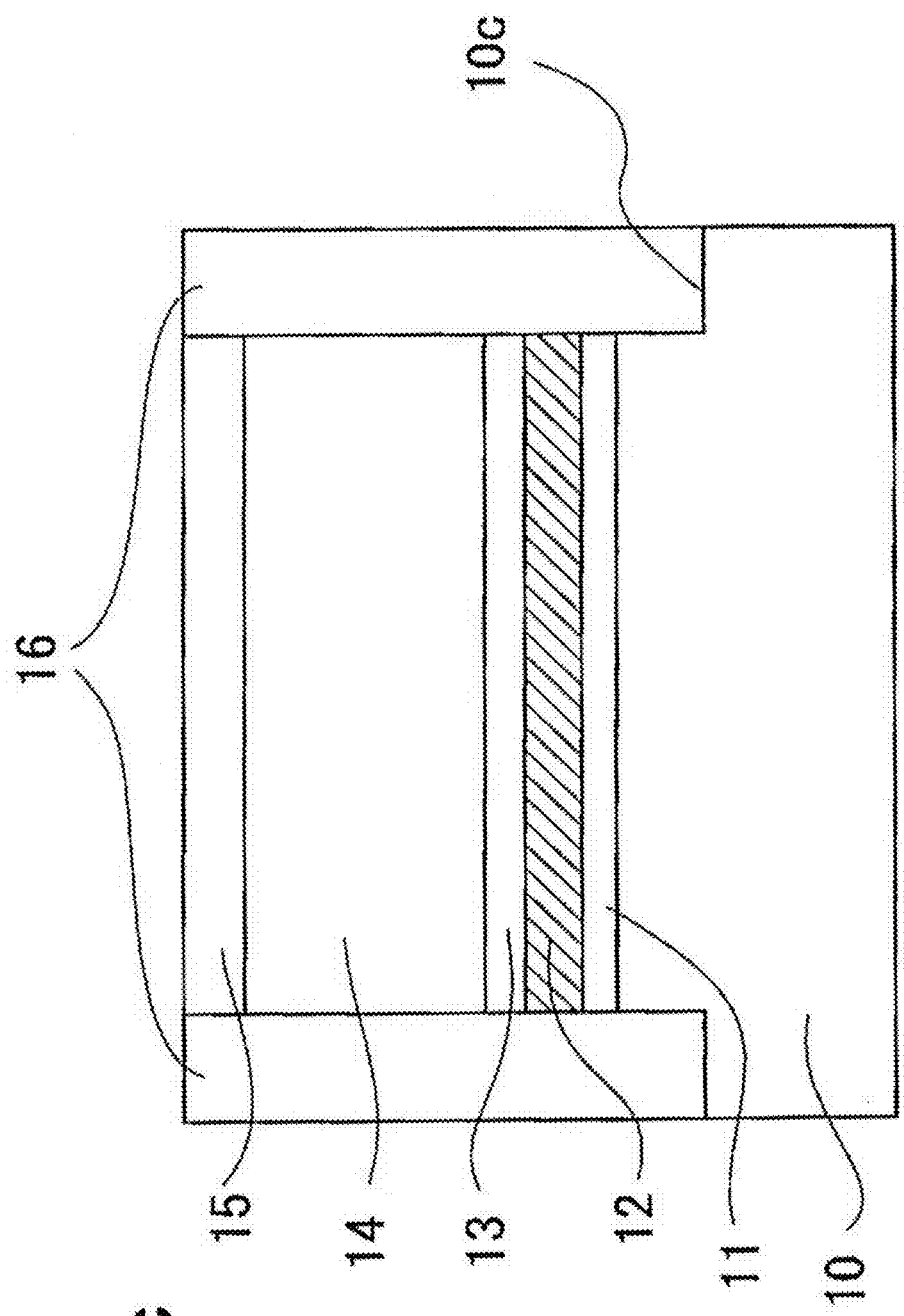

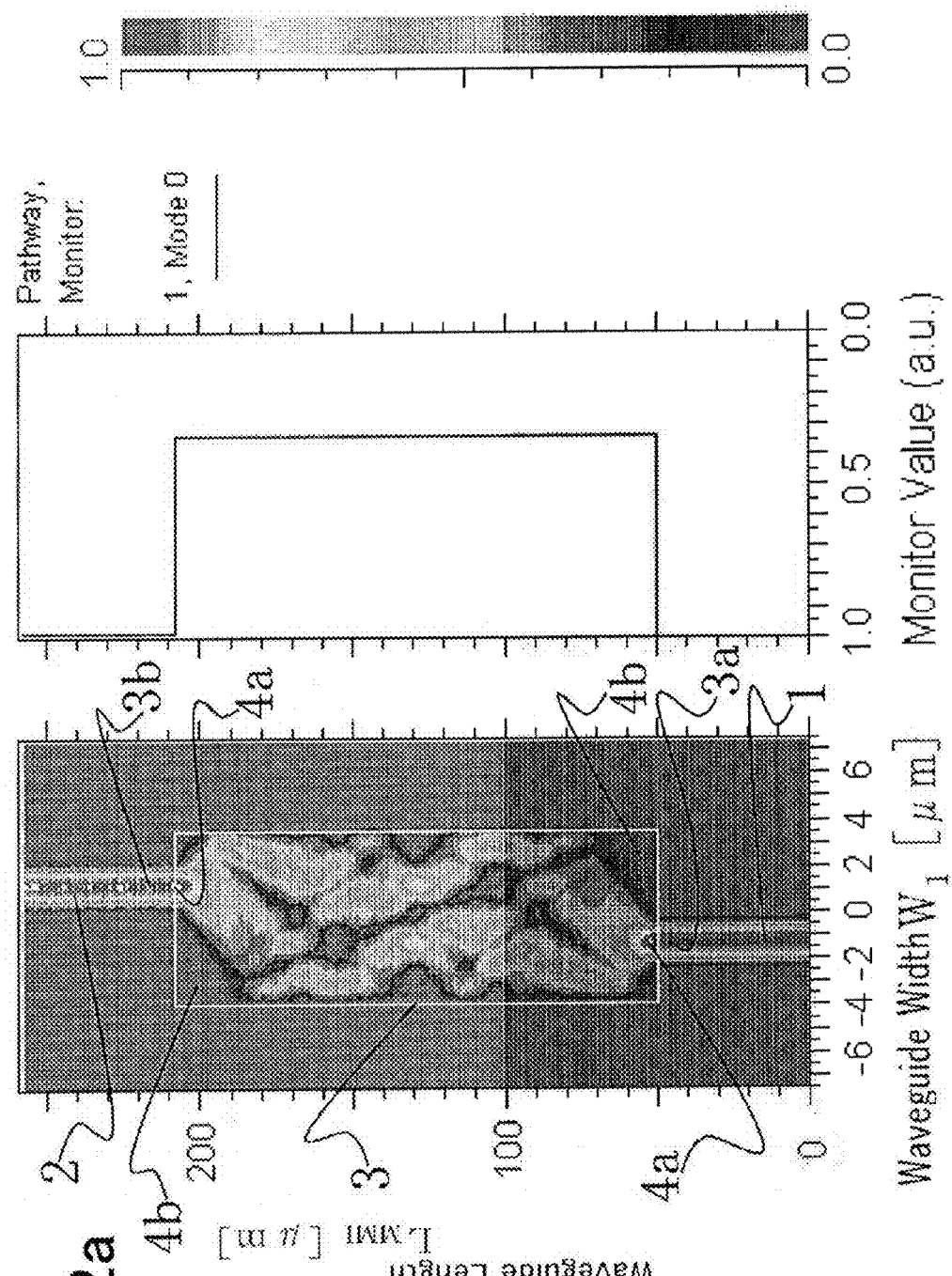

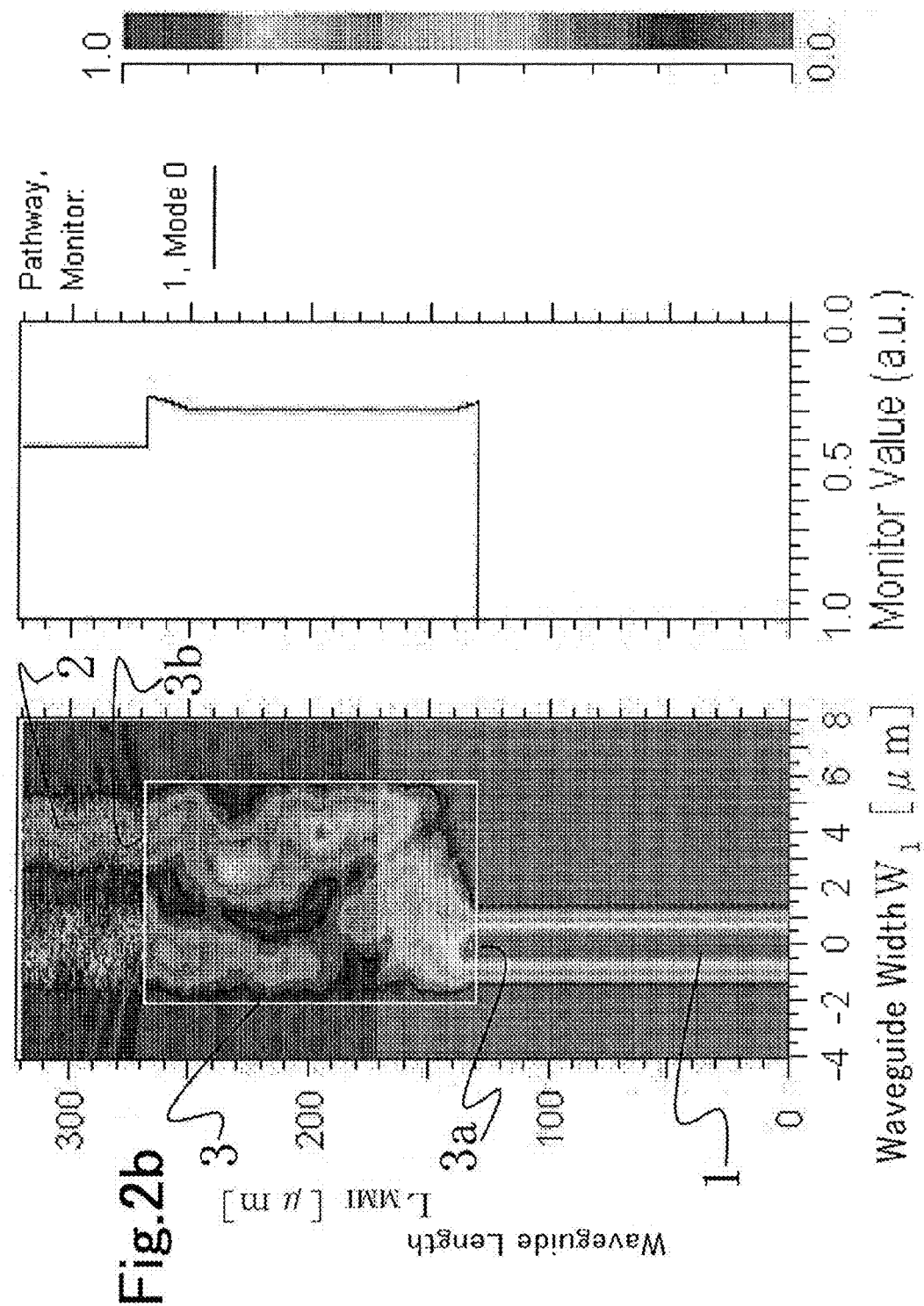

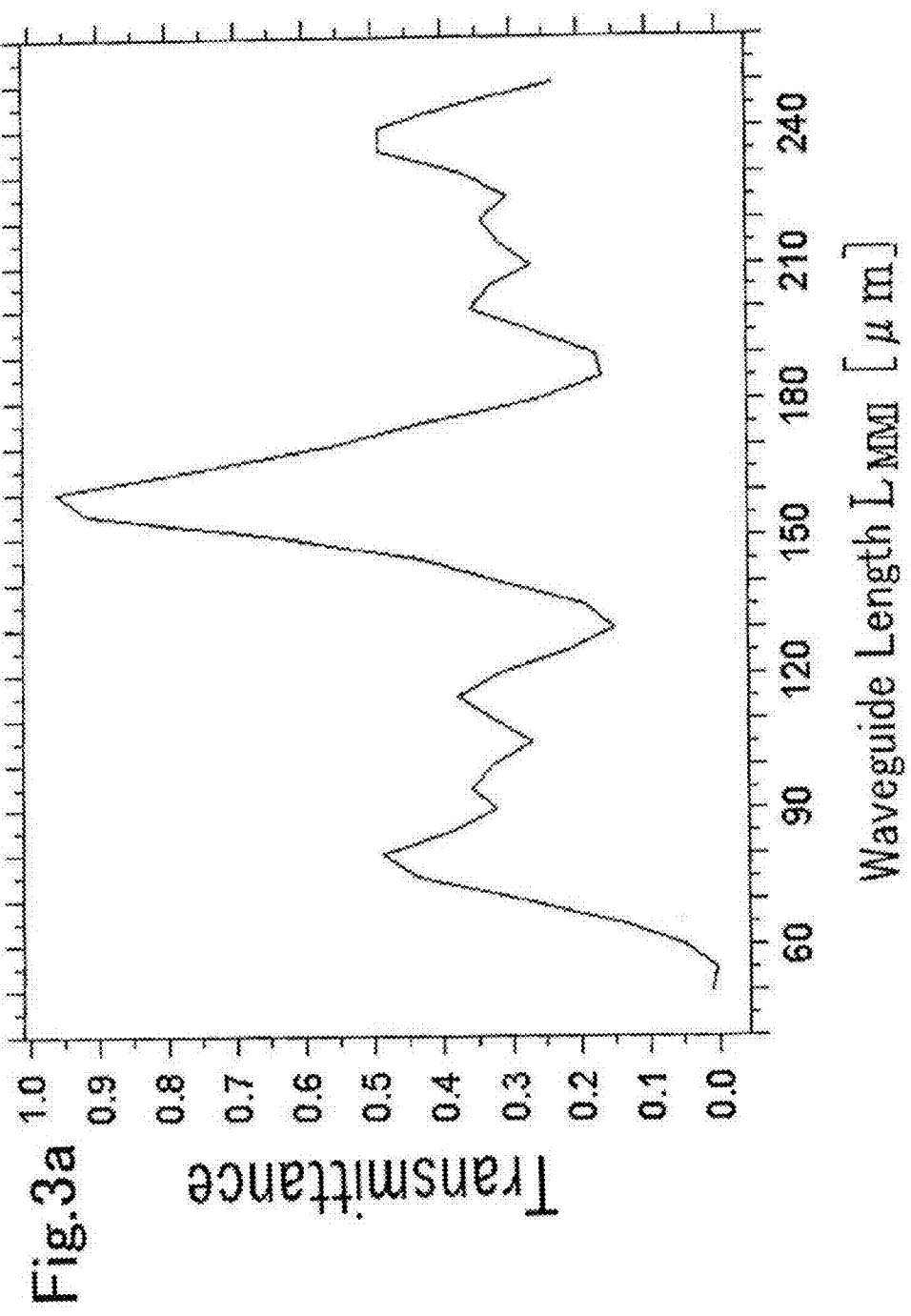

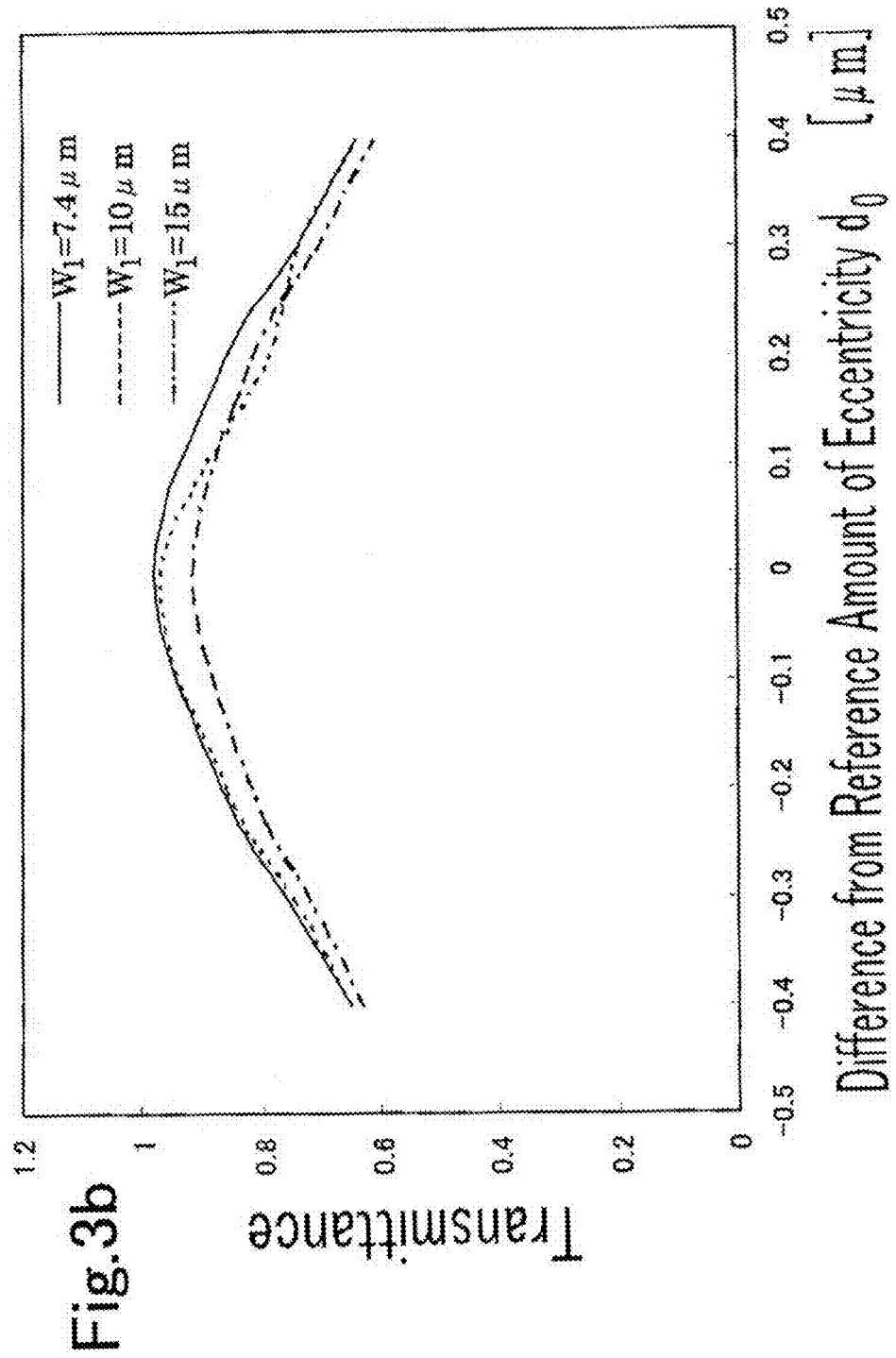

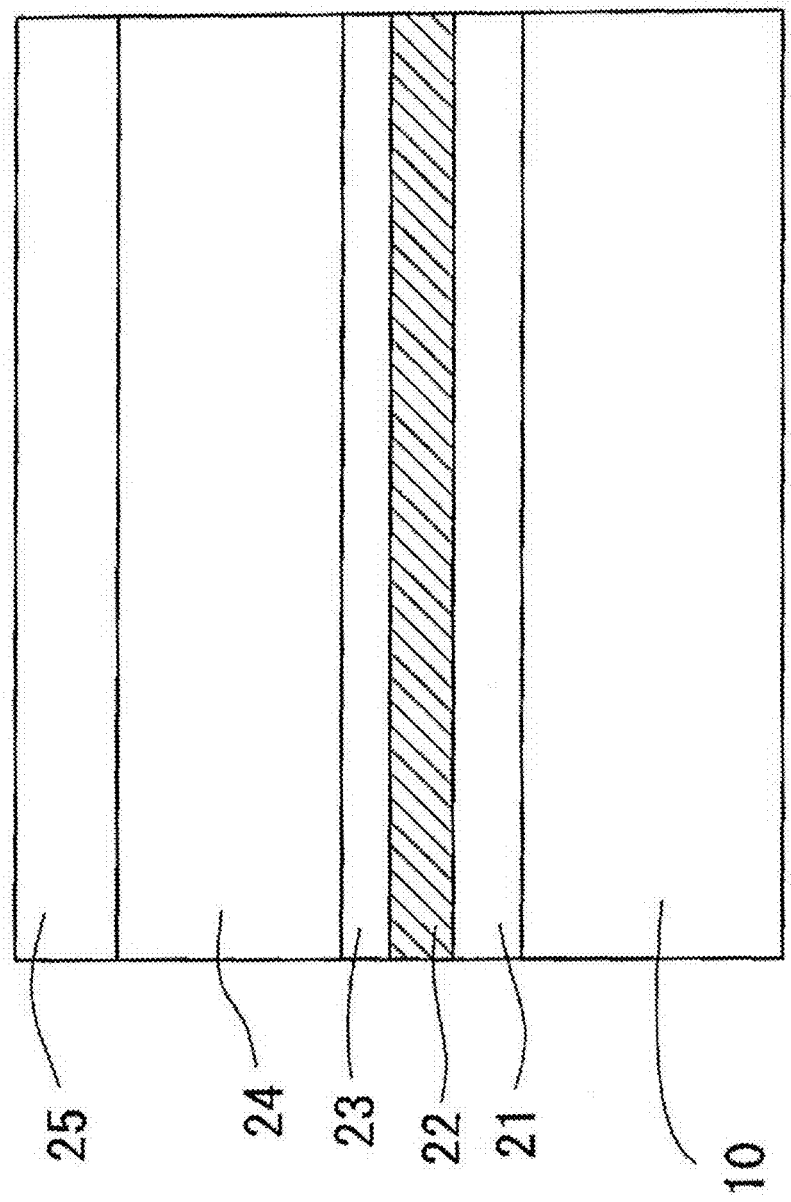

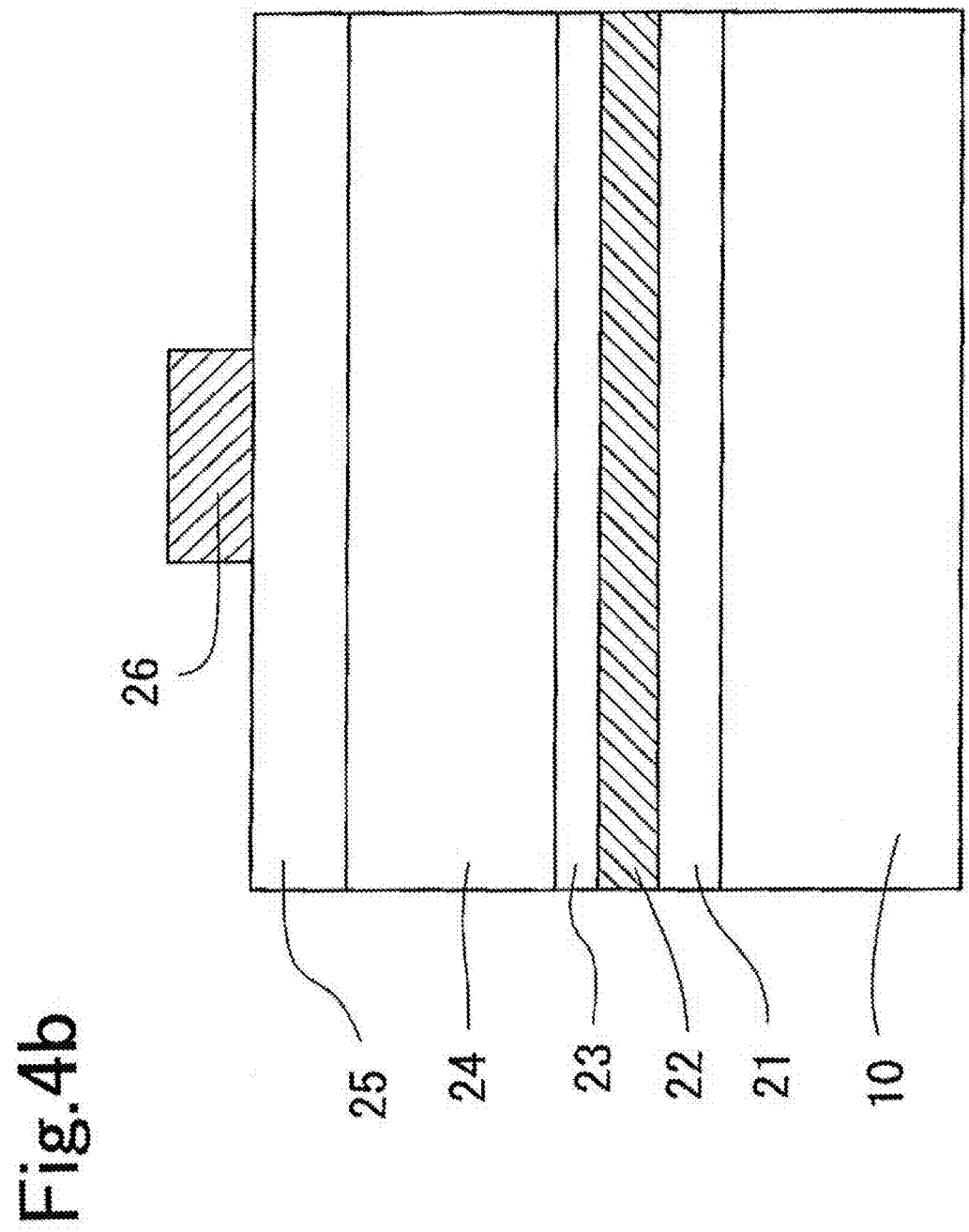

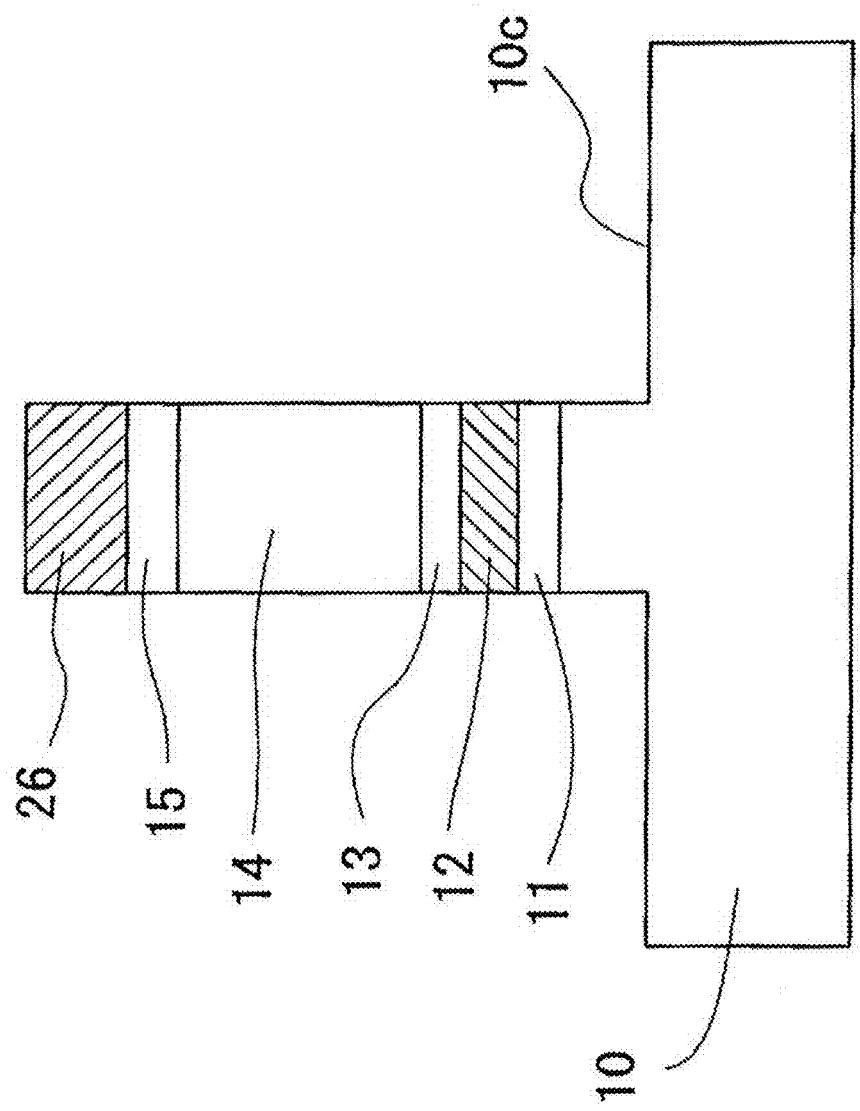

Fig.6a
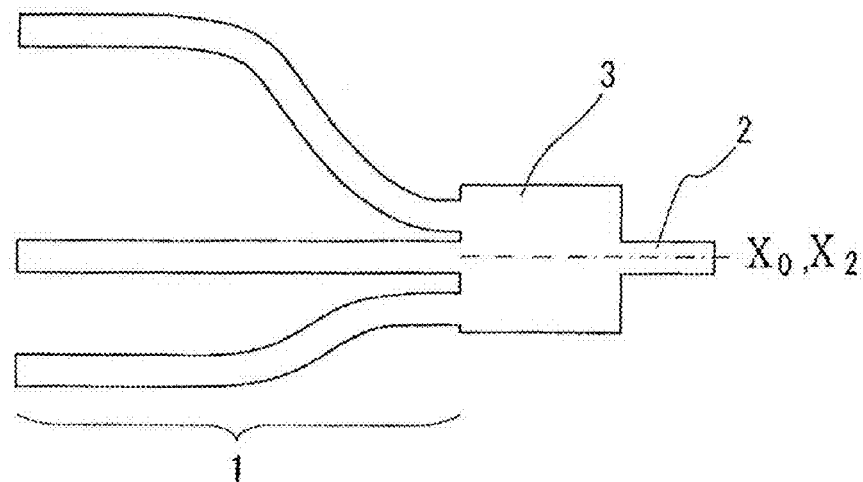

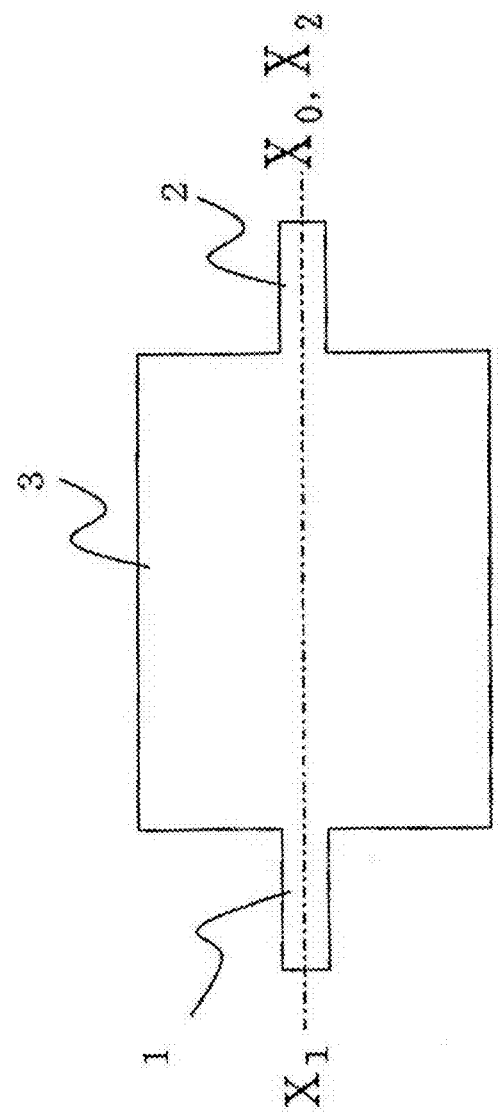

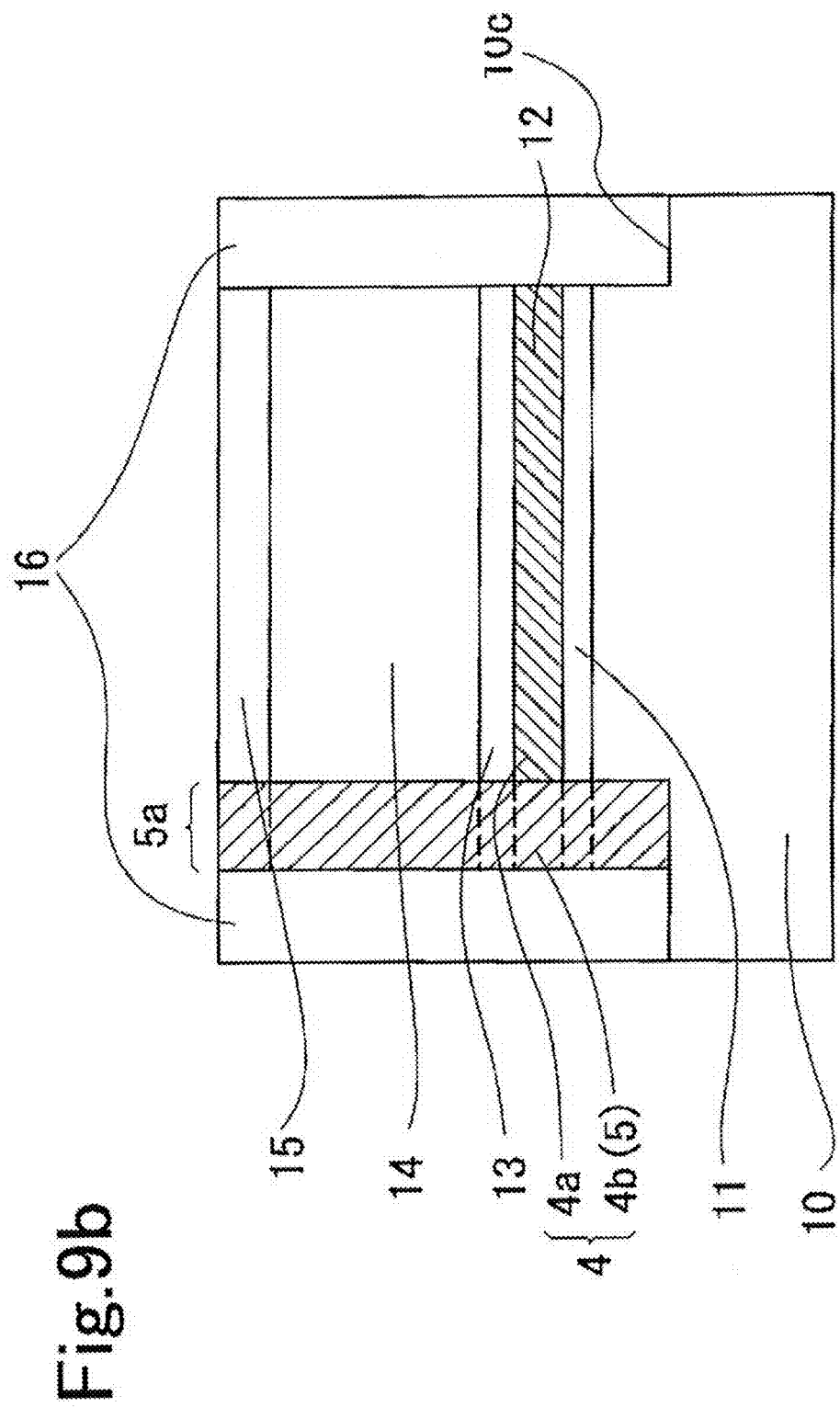

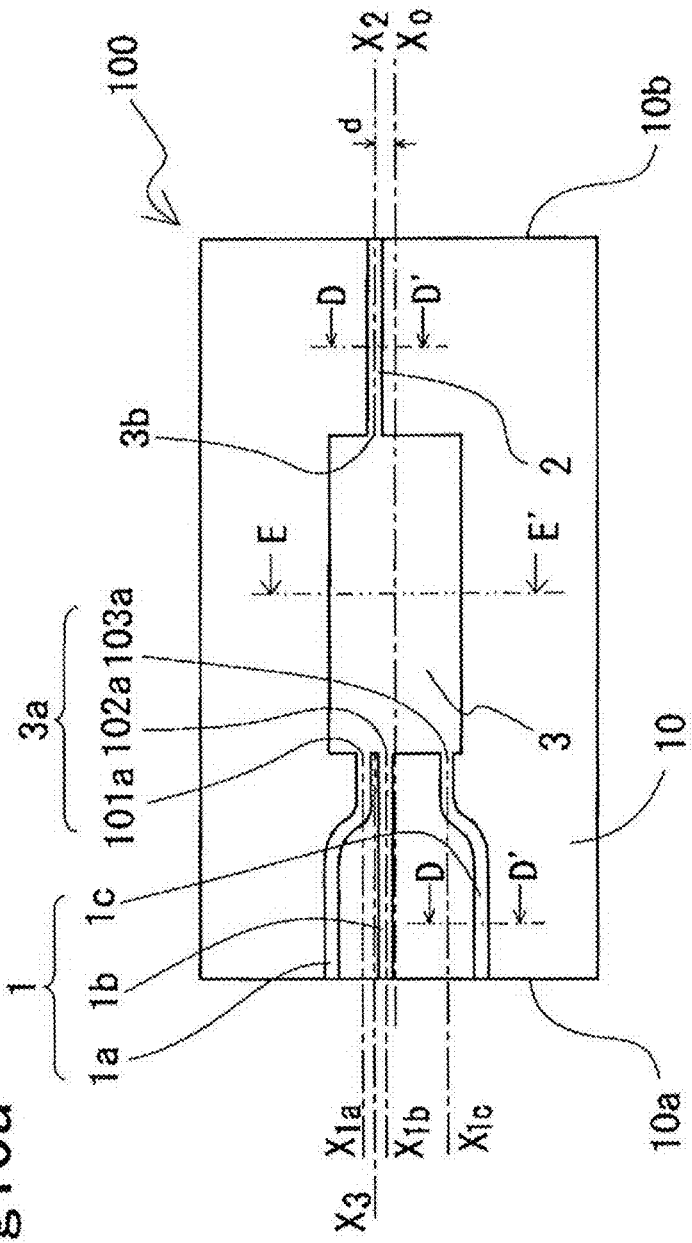

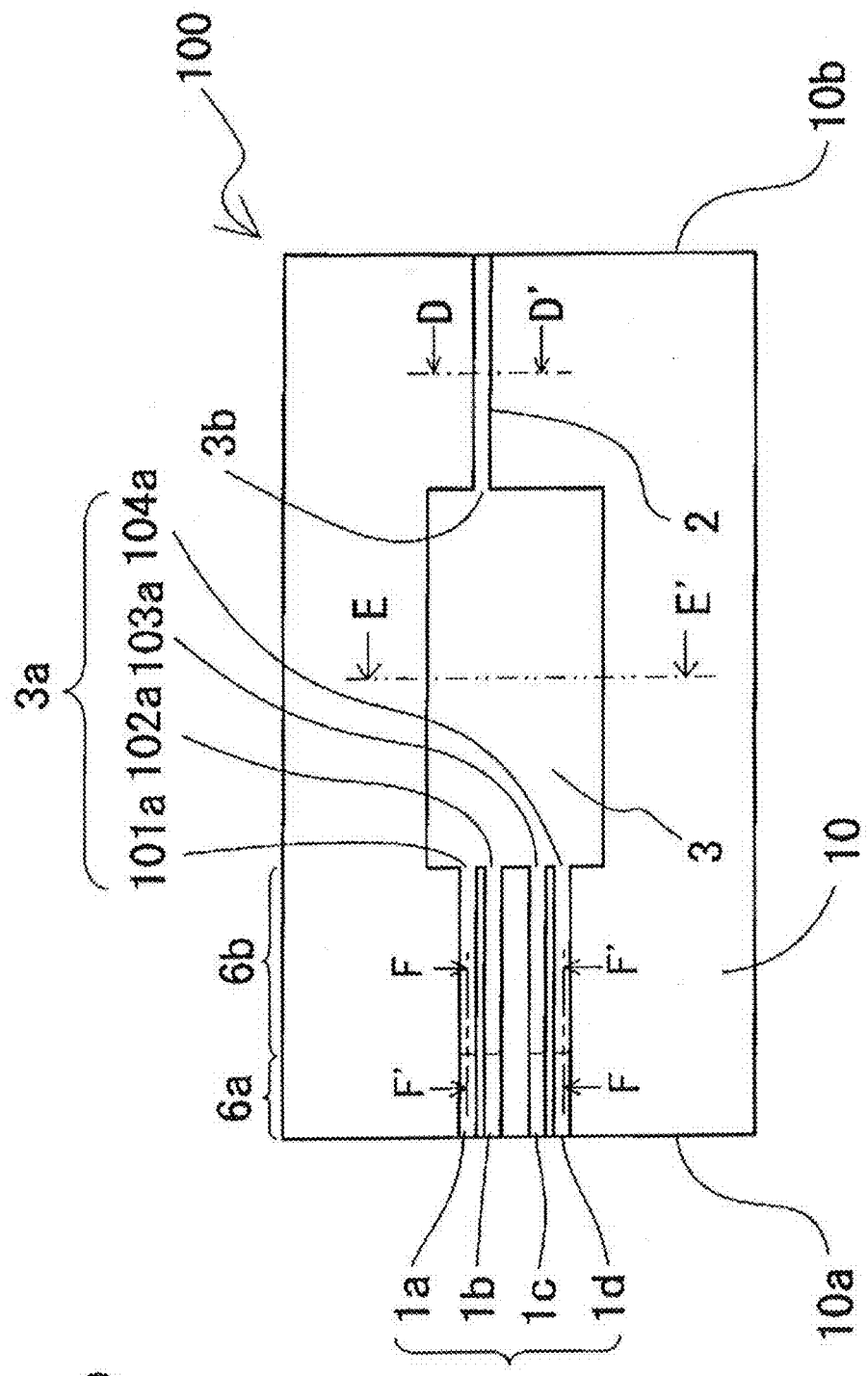

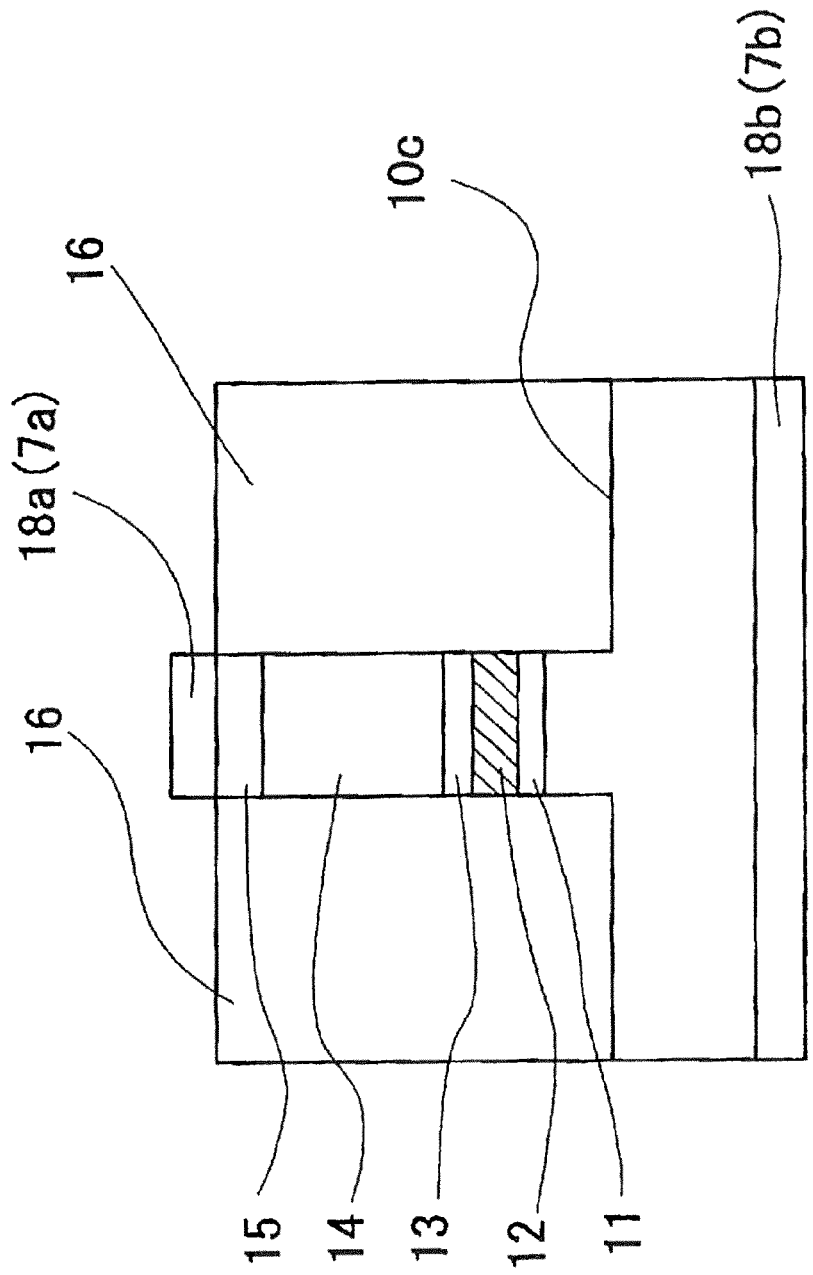

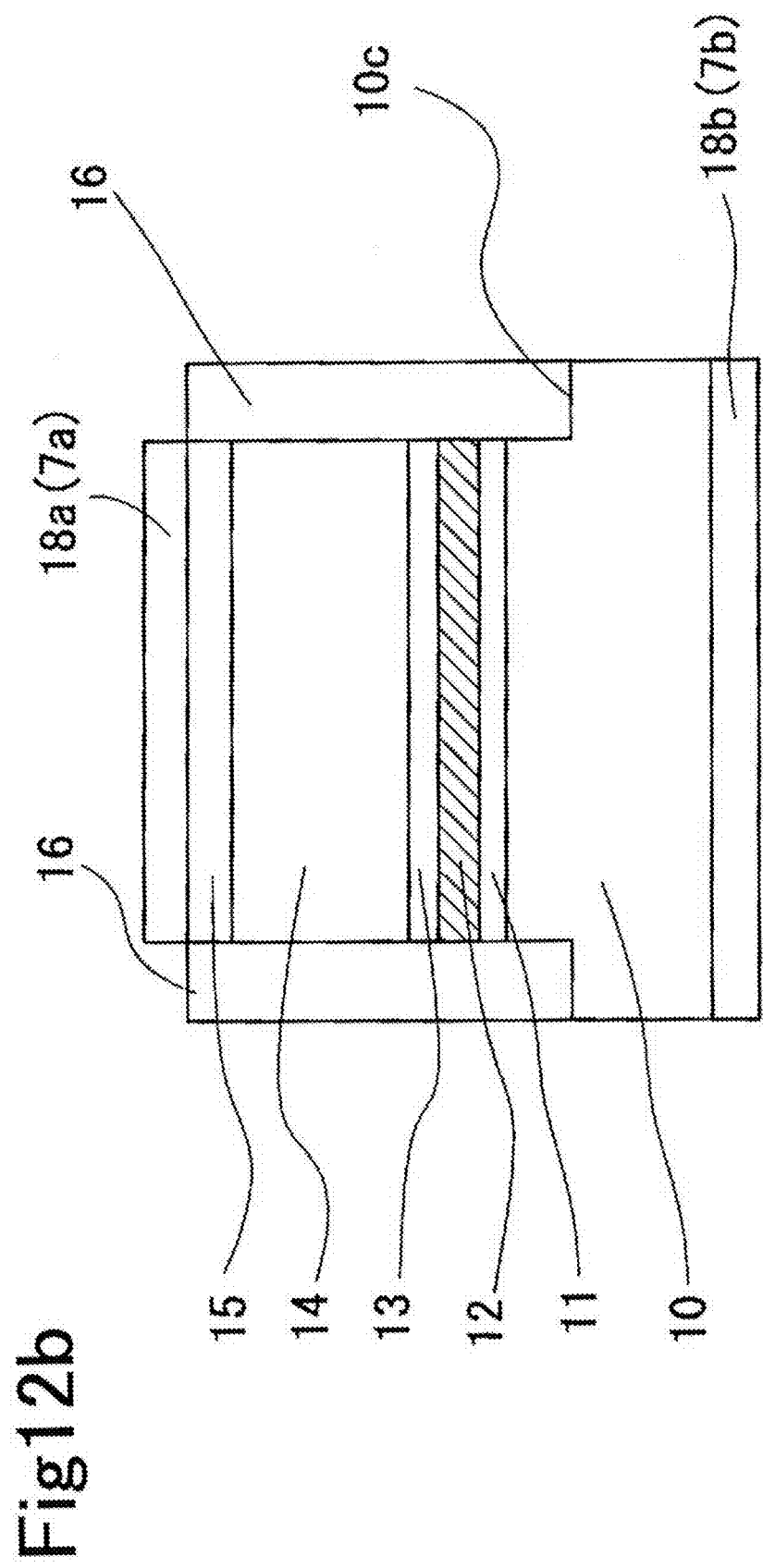

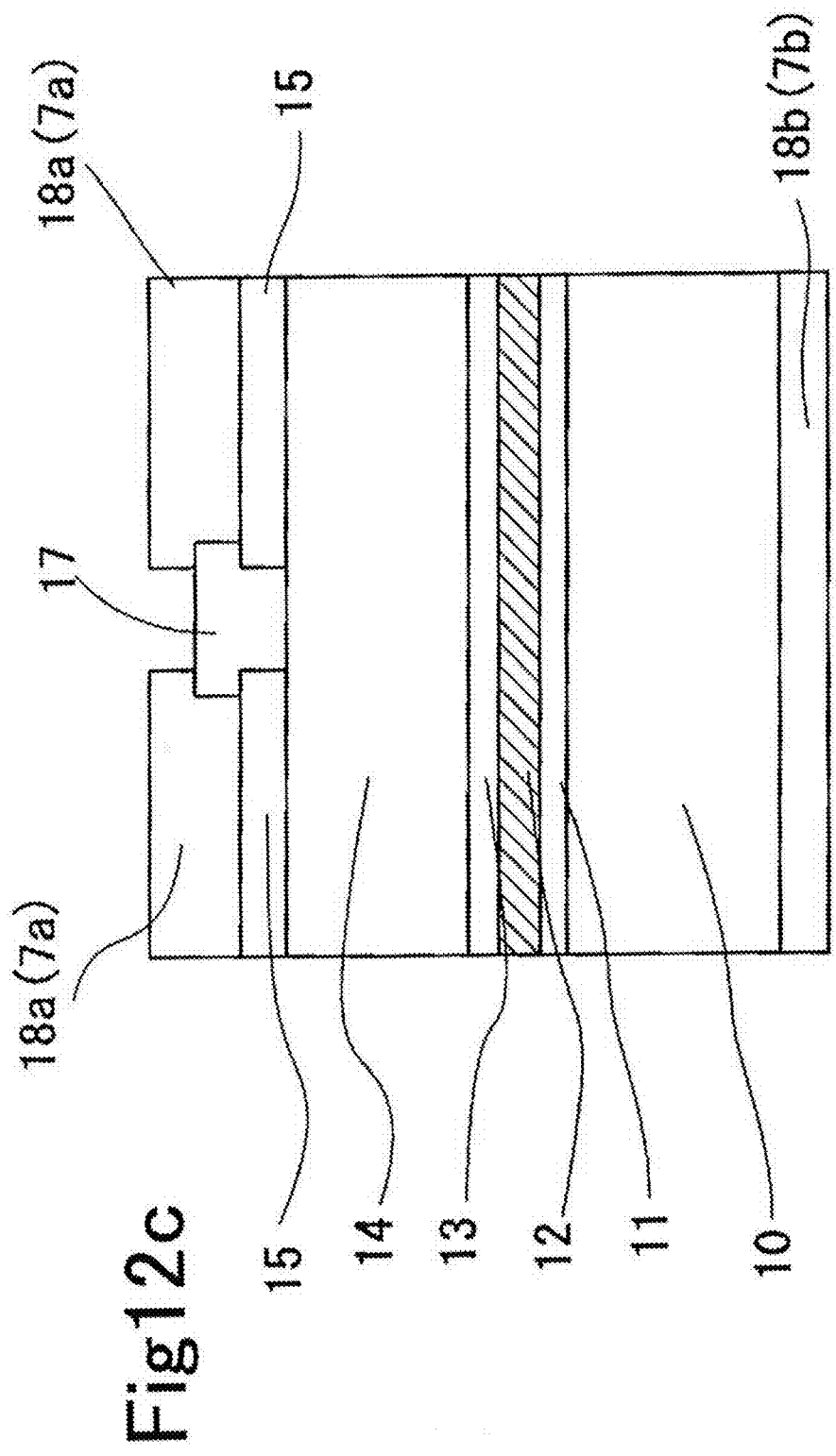

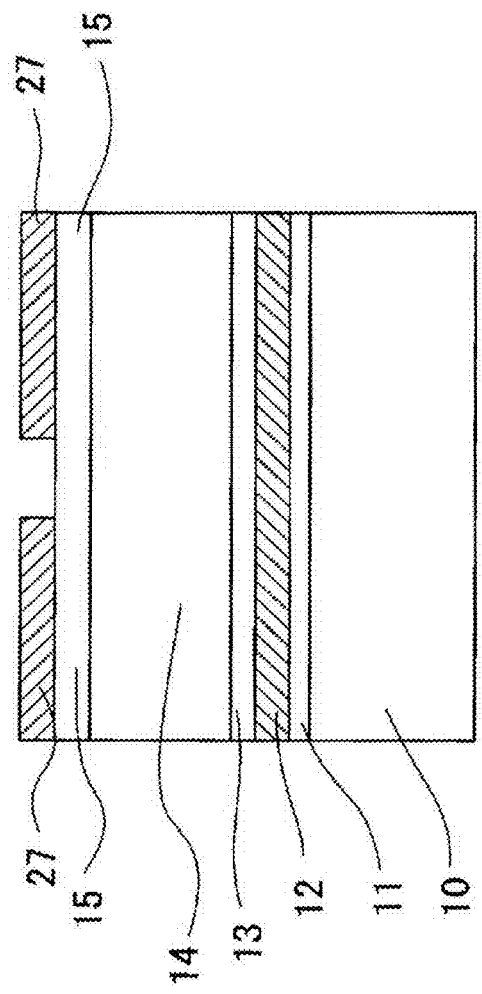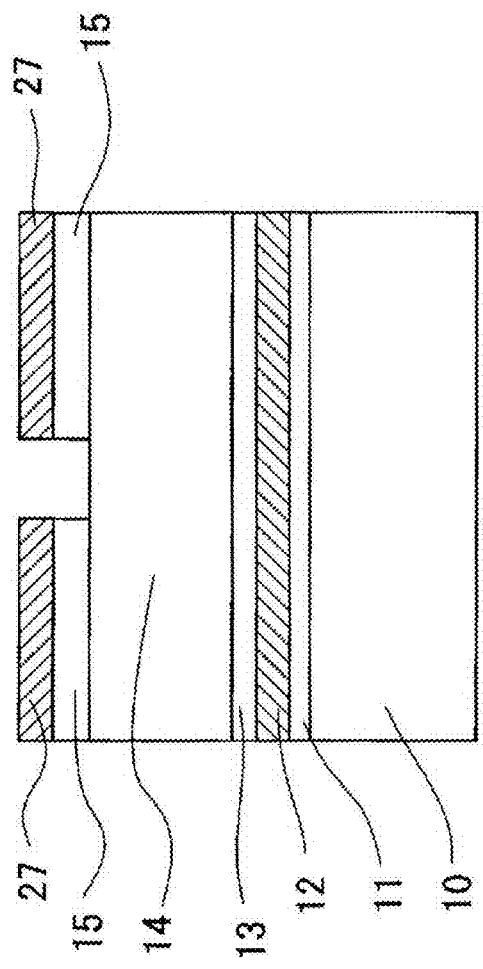

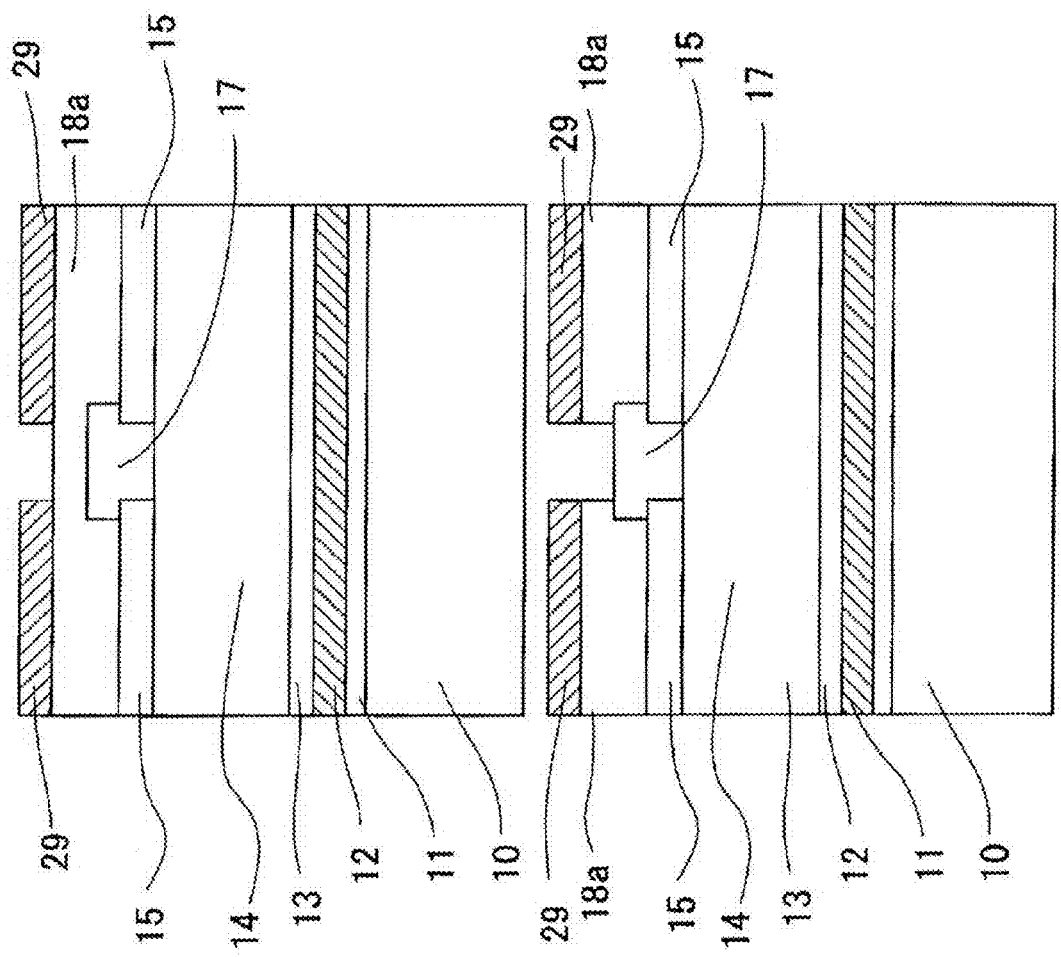

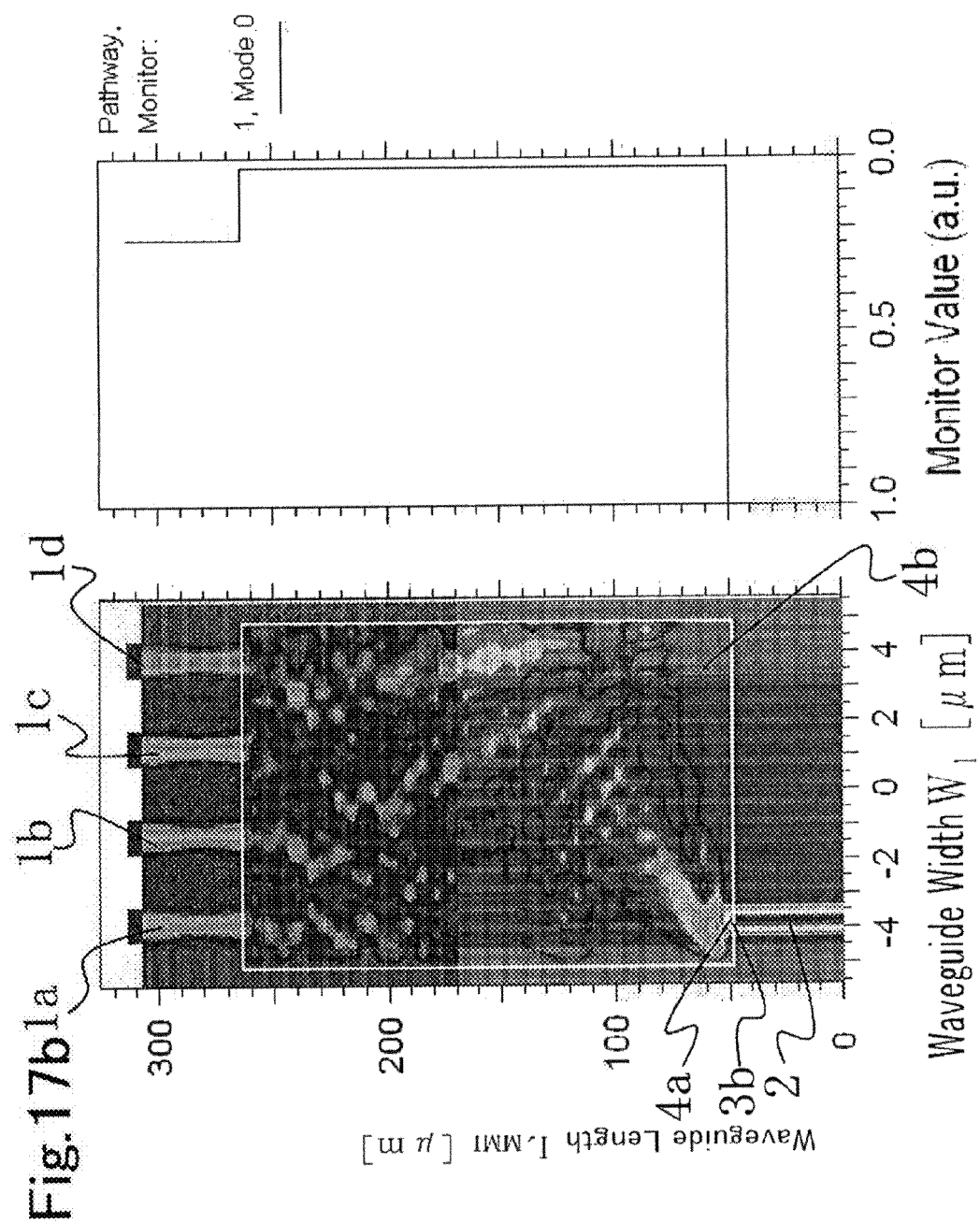

SEMICONDUCTOR LASER

RELATED APPLICATIONS

This patent application is a continuation of International Application No. PCT/JP2012/056590, filed on Mar. 14, 2012, entitled, "Semiconductor Laser," which claims priority to Japanese Patent Application No. 2011-055902, filed on Mar. 14, 2011, the contents and teachings of each of which are hereby incorporated by reference in their entirety.

TECHNICAL FIELD

The present invention relates to a semiconductor laser (a semiconductor laser, an LD: laser diode) provided with a multi-mode interference optical waveguide.

BACKGROUND OF THE INVENTION

A wavelength multiplexing technology (WDM: Wavelength Division Multiplex) has recently been exploited not only to a backbone network, but also to a local area network in order to satisfy a future information demand and a new service, with development of an information-communication society by the Internet. However, in connection with the local area network, it has been common to utilize, not a wavelength multiplexing system (DWDM (Dense WDM) system), which has been widely used in the backbone network, but a wavelength multiplexing system (CWDM (Coarse WDM) system) utilizing a wide range of wavelength, particularly in view of costs, as well as management and operation of the network.

In connection with a light source in the local area network, an existing light source has a technical limitation, and there has been made a study to make an attempt to increase further an amount of information, with development of an information-communication society by the Internet. Moreover, there is a need to reduce costs as low as possible, and consequently, it is necessary to make a study to avoid, as far as possible, use of an optical modulator, which is commonly used in a backbone network, and to apply a direct modulation of a semiconductor laser in a fundamental way, thus achieving a speed-up operation.

In response, there have been reported, as a configuration that utilizes a part of a cavity as a direct modulation region so as to permit increase in a relaxation frequency of oscillation, distributed reflector (DR: Distributed Reflector) type and distributed Bragg reflector (DBR: Distributed Bragg Reflector) type semiconductor lasers (see for example Non-Patent Document 1 and Non-Patent Document 2).

In addition, a conventional semiconductor laser is provided with a 1×3 multi-mode interference optical waveguide, a single optical waveguide that is provided at one end of the multi-mode interference optical waveguide to guide an optical wave, and three optical waveguides (a linear waveguide and a curved waveguide) that are provided at the other end of the multi-mode interference optical waveguide to guide a laser beam. The single linear waveguide and a part of two curved waveguides constitute an optical phase matching region to match a phase of a light on the respective front end surface, and a resonator is formed between the rear end surface and the front end surface (see for example Patent Document 1).

A conventional optical waveguide device comprises a first optical waveguide, a second optical waveguide that is formed of a different material of the first optical waveguide or has a different structure from the first optical waveguide, and is connected to the first optical waveguide, and a 1×1 multi-mode interference waveguide that is formed by increasing the width of the first optical waveguide and the second optical waveguide in a vicinity of a connection interface between the first optical waveguide and the second optical waveguide, in order to permit easy and reliable inhibition of influence of a reflected light in a connection interface (see for example Patent Document 2).

PRIOR ART DOCUMENT

Patent Document

Patent Document 1: Japanese Patent Provisional Publication No. 2009-54699
Patent Document 2: Pamphlet of International Publication No. WO2006/077641
Non-Patent Document 1: T. Kakitsuka, et al., "20-km Transmission of 40-Gb/s Signal using Frequency Modulated DBR Laser", Optical Fiber Communication Conference 2009, OThG4
Non-Patent Document 2: K. Otsubo, et al., "Low-Driving-Current high-Speed Direct Modulation up to 40 Gb/s Using 1.3-μm Semi-Insulating Buried-Heterostructure AlGaInAs-MQW Distributed Reflector (DR) Lasers", Optical Fiber Communication Conference 2009, OThT6

SUMMARY

The conventional distributed reflector type and distributed Bragg reflector type semiconductor lasers, which have respectively a structure in which a grating to emit light in a single wavelength is included in an entirety or a part of the waveguide, have a problem of a relatively high production cost of the resultant semiconductor laser. Especially, the conventional distributed reflector type and distributed Bragg reflector type semiconductor lasers have a problem of difficulty in application to the local area network, etc., in which there is a strong demand of reduction in costs.

In addition, the conventional semiconductor laser merely discloses a measure to match a phase of light on the front end surface, but does not provide any measure leading to oscillation with a single wavelength.

Further, in the conventional optical waveguide device, a DFB laser region is a single-mode waveguide having a small waveguide width, and there is no active layer in a separating region of an MMI waveguide, which is composed of an SOA region and the separating region, thus causing a problem that an area to which an electric current is to be injected is small, thus leading to difficulty in achieving a high-output semiconductor laser.

The present invention, which has been made to solve the above-mentioned problems, provides a semiconductor laser, which permits to achieve a light source excellent in a stable operation in low costs in comparison with the conventional semiconductor laser, and in which a Side Mode Suppression Ratio: SMSR=(Second Peak)/(Peak Level in the central wavelength) is high, thus leading to achievement of a good single mode operation. In addition, the present invention provides the semiconductor laser that permits an injection of a high electric current and easy achievement of a high output, since the multi-mode interference optical waveguide having the active layer in an entire area thereof in the planar view has a large width in comparison with a small-width optical waveguide, which is connected to the front port and the rear port.

A semiconductor laser according to the present invention comprises: a single front port and a single or a plurality of rear ports provided, and a multi-mode interference optical waveguide having an active layer in an entire area thereof in an planar view, wherein: the front port is eccentrically provided relative to a central line along a waveguide direction of the multi-mode interference optical waveguide in the planar view so as to correspond to an imaging point at which a fundamental mode light forms an image in the active layer, which is perpendicular to the waveguide direction of the multi-mode interference optical waveguide.

The semiconductor laser according to the present invention has a structure that is adapted to integration permitting to obtain single-wavelength characteristic properties only with the waveguide structure without using a grating, makes it possible to achieve the light source excellent in a stable operation in low costs in comparison with the conventional semiconductor laser, and to provide a high Side Mode Suppression Ratio (SMSR), thus leading to achievement of a good single mode operation.

BRIEF DESCRIPTION OF THE DRAWINGS

FIG. 1 (a) is a plan view illustrating an example of a schematic structure of a semiconductor laser according to the first embodiment of the present invention, (b) is a cross-sectional view cut along the line A-A' of the semiconductor laser as shown in FIG. 1(a), and (c) is a cross-sectional view cut along the line B-B' of the semiconductor laser as shown in FIG. 1(a);

FIG. 2 (a) is a descriptive view illustrating an optical field in which an optical intensity of a fundamental mode light having a main interference light wavelength λ of 1550 nm is simulated, in case where the waveguide length of the multi-mode interference optical waveguide as shown in FIG. 1(a) is coincident with a beat length, and (b) is a descriptive view illustrating an optical field in which an optical intensity of a fundamental mode light having a main interference light wavelength λ of 1550 nm is simulated, in case where the waveguide length of the multi-mode interference optical waveguide as shown in FIG. 1(a) is set as three-fourth of the beat length;

FIG. 3 (a) is a graph showing transmission properties of transmittance of the semiconductor laser relative to the waveguide length of the multi-mode interference optical waveguide as shown in FIG. 1(a), and (b) is a graph showing transmission properties of transmittance of the semiconductor laser relative to a difference from a reference amount of eccentricity of the multi-mode interference optical waveguide as shown in FIG. 1(a);

FIG. 4 illustrates a method for manufacturing the semiconductor laser according to the first embodiment of the present invention, (a) is a cross-sectional view illustrating a state in which a crystal structure, which corresponds to the cross-sectional view cut along the line A-A' of the semiconductor laser as shown in FIG. 1(a), is prepared in accordance with an MOVPE method, and (b) is a cross-sectional view illustrating a state in which a mask, which corresponds to the cross-sectional view cut along the line A-A' of the semiconductor laser as shown in FIG. 1(a), is prepared;

FIG. 6 (a) is a plan view illustrating an example of the schematic structure of the semiconductor laser according to Comparative Example No. 1, (b) is a plan view illustrating an example of the schematic structure of the semiconductor laser according to another comparative example, and (c) is a plan view illustrating an example of the schematic structure of the semiconductor laser according to still another comparative example;

FIG. 12 (a) is a cross-sectional view cut along the line D-D' of the semiconductor laser as shown in FIG. 10(b) and FIG. 11(b), (b) is a cross-sectional view cut along the line E-E' of the semiconductor laser as shown in FIG. 10(b) and FIG. 11(b), and (c) is a cross-sectional view cut along the line F-F' of the semiconductor laser as shown in FIG. 10(b) and FIG. 11(b), FIG. 13 (a) is a descriptive view illustrating an optical field in which an optical intensity of a fundamental mode light having a main interference light wavelength λ of 1550 nm is simulated, in case where the waveguide length of the 3×1 multi-mode interference optical waveguide as shown in FIG. 10(a) is set as one-third of the beat length, and (b) is a descriptive view illustrating an optical field in which an optical intensity of a fundamental mode light having a main interference light wavelength λ of 1550 nm is simulated, in case where the waveguide length of the 4×1 multi-mode interference optical waveguide as shown in FIG. 11(a) is set as one-fourth of the beat length;

DETAILED DESCRIPTION

First Embodiment of the Present Invention

Figure 5B:
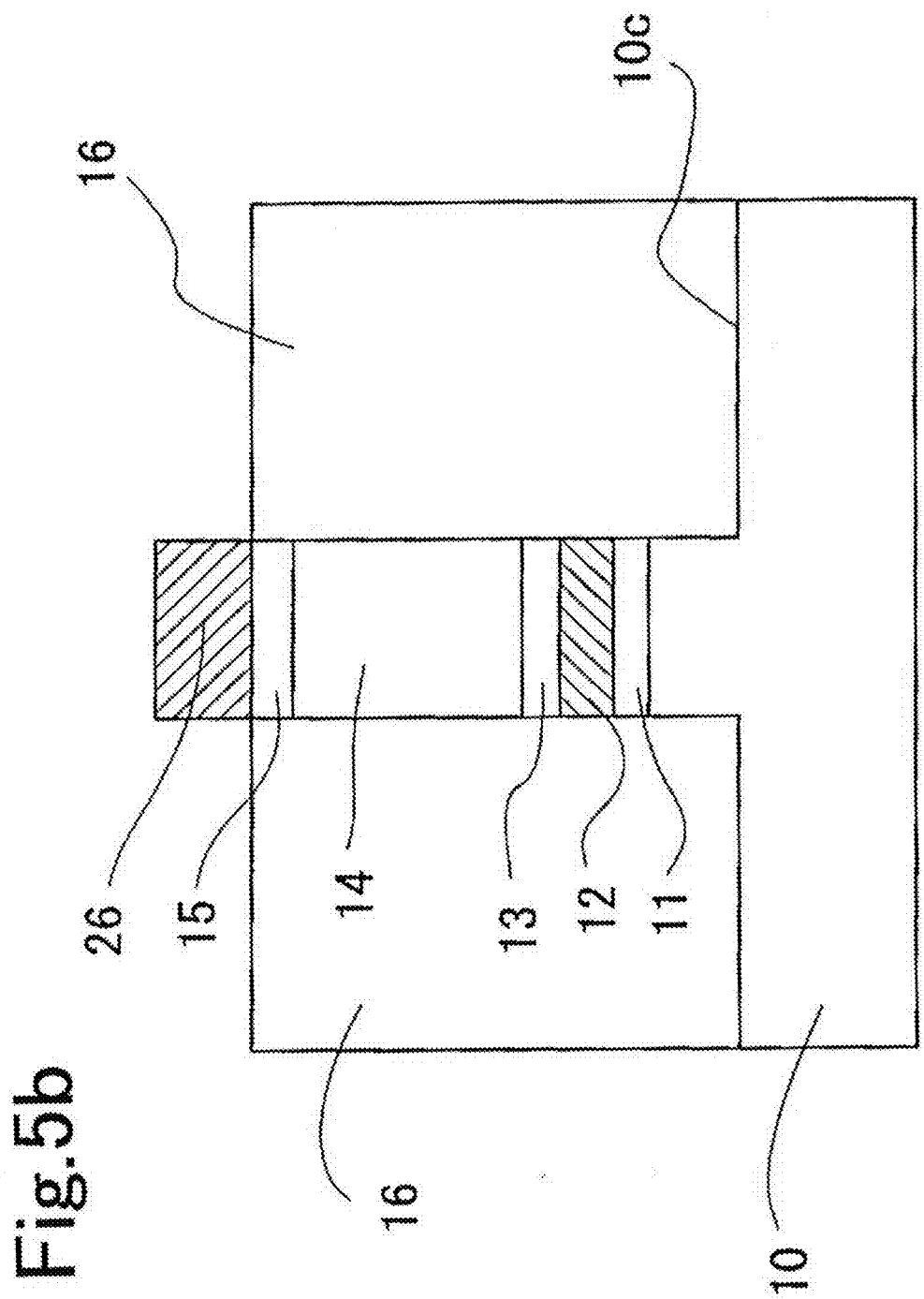
FIG. 5 illustrates a method for manufacturing the semiconductor laser according to the first embodiment of the present invention, (a) is a cross-sectional view illustrating a state in which a high-mesa structure, which corresponds to the cross-sectional view cut along the line A-A' of the semiconductor laser as shown in FIG. 1(a), is prepared by an etching method, and (b) is a cross-sectional view illustrating an embedded state utilizing a BCB, which corresponds to the cross-sectional view cut along the line A-A' of the semiconductor laser as shown in FIG. 1(a)

A semiconductor laser 100 has a structure in which a small-width optical waveguide and a multi-mode interference optical waveguide are provided on a substrate 10, and a forward bias is applied across a PN junction provided inside and holes and electrons are confined in an active layer and recombination of them causes an emitted light to be radiated outside.

In the semiconductor laser 100 according to the embodiment of the present invention, a rear small-width waveguide 1, a front small-width waveguide 2 and a multi-mode interference optical waveguide 3 are integrated on the substrate 10, and the rear small-width waveguide 1, the multi-mode interference optical waveguide 3 and the front small-width waveguide 2 form a resonator between an end surface 10a and another end surface 10b of the substrate 10, as shown in FIG. 1(a).

The rear small-width waveguide 1, the front small-width waveguide 2 and the multi-mode interference optical waveguide 3 have the same layer structure and are a high-mesa structure.

These cross-sectional structures are the high-mesa structure in which a buffer layer 11 formed of n-InP of an N-type semiconductor, a light emitting layer 12 formed of InGaAsP/InGaAsP serving as an active layer, which achieves a semiconductor laser having a long-wavelength range (1.55 µm range), a first clad layer 13 formed of i-InP of an intrinsic semiconductor, a second clad layer 14 formed of p-InP of a P-type semiconductor, and a contact layer 15 formed of p-InGaAs of a P-type semiconductor are grown on a substrate layer 10 as a base material of n-InP substrate, as shown in FIG. 1(b) and FIG. 1(c). In addition, for the high-mesa structure, BCB (benzocyclobutene) as a low-dielectric organic film is embedded into a non-waveguide region to form an embedded layer 16.

This high-mesa structure is a structure in which a part of the substrate layer 10 is removed by an etching method together with the contact layer 15, the second clad layer 14, the first clad layer 13, the light emitting layer 12 and the buffer layer 11, in the non-waveguide region (the region into which BCB is to be embedded), as shown in FIG. 1(b) and FIG. 1(c).

The light emitting layer 12 is a normal light emitting layer, which is composed of a SCH (Separate Confinement Heterostructure) and an MQW (Multi-Quantum Well).

Especially, in the embodiment of the present invention, the buffer layer 11 has a film thickness of about 100 nm, the light emitting layer 12 has a film thickness of about 100 nm, the first clad layer 13 has a film thickness of about 100 nm, the second clad layer 14 has a film thickness of about 900 nm, and the contact layer 15 has a film thickness of about 150 nm.

The multi-mode interference optical waveguide 3 is an M×1 multi-mode interference optical waveguide (M being an integer equal to or more than 1), which is provided with a single or a plurality of rear ports 3a (the port on the side of one end surface 10a, not assumed to radiate a light) and a single front port 3b (the port on the other end surface 10b for radiating a light), and has the active layer (the light emitting layer 12) in an entire area thereof in an planar view as shown in FIG. 1(a).

The front port 3b of the multi-mode interference optical waveguide 3 corresponds to an imaging point 4a at which a fundamental (zeroth) mode light forms an image in the active layer (the light emitting layer 12), which is perpendicular to the waveguide direction of the multi-mode interference optical waveguide 3 (see FIG. 2(a)), and has a central line $X_2$, which is eccentrically placed relative to a central line $X_0$ along a waveguide direction of the multi-mode interference optical waveguide 3 in the planar view as shown in FIG. 1(a).

The 1×1 multi-mode interference optical waveguide 3 in which M is 1, is described as an example in the embodiment of the present invention, but the present invention is not limited only to such a 1×1 multi-mode interference optical waveguide 3. Especially, the 1×1 multi-mode interference optical waveguide 3 according to the embodiment of the present invention has substantially a rectangular interference region in which the length of the waveguide (hereinafter referred to as the "waveguide length") along the waveguide direction of a light is about 158 µm and a waveguide width is about 7.4 µm.

The rear port 3a of the 1×1 multi-mode interference optical waveguide 3 has a central line $X_1$, which is eccentrically placed relative to the central line $X_0$ along the waveguide direction of the multi-mode interference optical waveguide 3 in the planar view as shown in FIG. 1(a) and is eccentrically placed relative to the central line $X_2$ of the front port 3b in the planar view as shown in FIG. 1(a). Especially, the rear port 3a and the front port 3b of the 1×1 multi-mode interference optical waveguide 3 are placed symmetrically with respect to the central point of the 1×1 multi-mode interference optical waveguide 3 in the planar view as shown in FIG. 1(a).

The multi-mode interference optical waveguide 3 may be designed with the known prior art. However, it may be designed based on an MMI (Multimode Interference) theory as described below.

An equation of a beat length ($L_\pi$) derived in accordance with the MMI theory may be expressed as Equation 1 indicated below, wherein $W_1$ representing a waveguide width of the multi-mode interference region, $W_e$ representing an effective waveguide width of the multi-mode interference region, $n_r$ representing an effective refraction index of the waveguide (core), $n_c$ representing an effective refraction index of a clad and $\lambda_0$ being an incident light wavelength (a central wavelength) in Equation 1. In addition, σ represents σ=0 in a TE mode, and σ=1 in a TM mode.

$$W_e = W_1 + (\lambda_0/\pi)(n_c/n_r)^{2\sigma}(n_r^2 - n_c^2)^{-1/2}$$

$$L_\pi = 4n_r W_e^2 / 3\lambda_0 \qquad \text{Equation (1)}$$

The multi-mode interference optical waveguide 3 may operate as the 1×N optical waveguide in case where it may be expressed by Equation (2) as indicated below. Alternatively, the multi-mode interference optical waveguide 3 may operate as the M×N optical waveguide in case where it may be expressed by Equation (3) as indicated below. In these equations, M and N are a positive integer, and M on the input side may be 1 and N on the output side may be 2 or more. In Equation (2) and Equation (3), $L_{MMI}$ represents a waveguide length of the multi-mode interference optical waveguide 3.

$$L_{MMI} = (3/4N)L_\pi \text{ (wherein, } N \text{ being a positive integer)} \quad \text{Equation (2)}$$

$$L_{MMI} = (3/N)L_\pi \text{ (wherein, } N \text{ being a positive integer)} \quad \text{Equation (3)}$$

Here, the optical field as shown in FIG. 2(b) may be obtained in case where an optical intensity of a fundamental mode light having a main interference light wavelength λ of 1550 nm is simulated, in the 1×1 multi-mode interference optical waveguide 3 as shown in FIG. 1, in which "N" in Equation (2) is set as 1, and the central line $X_2$ of the front small-width waveguide 2 is eccentrically placed relative to the central line $X_0$ of the multi-mode interference optical waveguide 3 and the central line $X_1$ of the rear small-width waveguide 1 (hereinafter referred to as the "asymmetric MMI 3").

When the waveguide length $L_{MMI}$ of the asymmetric MMI 3 is equal to $(3/4) \times L_\pi$ (the beat length), as shown in FIG. 2(b), the fundamental mode light is dispersed into two on the side of the front port 3b of the asymmetric MMI 3, with the result that the transmittance of the fundamental mode light radiated from the single front port 3b becomes low.

The applicants have derived a theoretical equation of the optimum waveguide length $L_{MMI}$ of the asymmetric MMI 3 (see Equation (4) as indicated below), by calculating the transmittance of the fundamental mode light as radiated from the single front port 3b, while varying the waveguide length $L_{MMI}$ of the asymmetric MMI 3, to verify the transmission properties of the semiconductor laser 100 provided with the asymmetric MMI 3 (see FIG. 3(a)).

$$L_{MMI} = L_\pi \quad \text{Equation (4)}$$

The optical field as shown in FIG. 2(a) was obtained based on Equation (4), in case where the optical intensity of the fundamental mode light having the main interference light wavelength λ for example of 1550 nm is simulated in the asymmetric MMI 3 in which the waveguide length $L_{MMI}$ is coincident with the beat length $L_\pi$. More specifically, in case where the waveguide length $L_{MMI}$ of the asymmetric MMI 3 is $1 \times L_\pi$ (the beat length) as shown in FIG. 2(a), the fundamental mode light forms an image in a single area (the front port 3b) on the end surface on the side of the front port 3b of the asymmetric MMI 3, thus making it possible to enhance the transmittance of the fundamental mode light radiated from the single front port 3b.

The rear small-width waveguide 1 is composed of M optical waveguides, the ends of which are connected to the respective rear ports 3a of the multi-mode interference optical waveguide 3, and the respective optical waveguides of the rear small-width waveguide 1 are the single mode waveguide, which blocks a high-order mode light. The other end surface of the respective optical waveguides of the rear small-width waveguide 1 serves as a reflection surface. The rear small-width waveguide 1 may be a second mode cut-off waveguide, which blocks the second mode light. In this case, the structure in which the semiconductor laser 100 is provided with the 1×1 multi-mode interference optical waveguide 3 permits to achieve a good single mode operation, without oscillating simultaneously the basic (zeroth) mode light and the second mode light.

In the embodiment of the present invention, the rear small-width waveguide 1 is described as the single optical waveguide, in order to explain an example of the 1×1 multi-mode interference optical waveguide 3. Especially, the rear small-width waveguide 1 according to the embodiment of the present invention is a linear waveguide only including the linear region, in which the waveguide length is about 50 μm and the waveguide width is about 2.7 μm. The central line $X_1$ of the rear small-width waveguide 1 is coincident with the central line $X_1$ of the rear port 3a in the planar view as shown in FIG. 1(a), and the rear small-width waveguide 1 has the central line $X_1$, which is eccentrically placed relative to the central line $X_0$ along the waveguide direction of the 1×1 multi-mode interference optical waveguide 3 in the planar view as shown in FIG. 1(a).

The front small-width waveguide 2 is composed of a single optical waveguide, one end of which is connected to the front port 3b of the multi-mode interference optical waveguide 3, and the front small-width waveguide 2 is the single mode waveguide, which blocks a high-order mode light. The other end surface of the front small-width waveguide 2 serves as a radiation surface. The front small-width waveguide 2 may be a second mode cut-off waveguide, which blocks the second mode light. In this case, the structure in which the semiconductor laser 100 is provided with the 1×1 multi-mode interference optical waveguide 3 permits to achieve a good single mode operation, without oscillating simultaneously the basic (zeroth) mode light and the second mode light. Especially, the front small-width waveguide 2 according to the embodiment of the present invention is a linear waveguide only including the linear region, in which the waveguide length is about 50 μm and the waveguide width is about 2.7 μm. The central line $X_2$ of the front small-width waveguide 2 is coincident with the central line $X_2$ of the front port 3b in the planar view as shown in FIG. 1(a), and the front small-width waveguide 2 has the central line $X_2$, which is eccentrically placed relative to the central line $X_0$ along the waveguide direction of the 1×1 multi-mode interference optical waveguide 3 in the planar view as shown in FIG. 1(a) and is eccentrically placed relative to the central line $X_1$ of the rear small-width waveguide 1 in the planar view as shown in FIG. 1(a).

Now, description will be given below of a method for manufacturing the semiconductor laser 100 according to the embodiment of the present invention with reference to FIG. 1, FIG. 4 and FIG. 5. First, an n-InP film 21, an InGaAsP/InGaAsP-1.55 μm film 22, an i-InP film 23, a p-InP film 24 and a p-InGaAs film 25 are laminated in the order on a normal n-InP substrate 10, utilizing an MOVPE (Metal-Organic Vapor Phase Epitaxy) process, to prepare a laminated layer (FIG. 4(a)).

A mask 26 for etching is formed on the p-InGaAs film 25 so as to be matched with planar shapes of the rear small-width waveguide 1, the multi-mode interference optical waveguide 3 and the front small-width waveguide 2 as shown in FIG. 1(a), utilizing a conventional photolithography process by a stepper (a reduced projection exposure device) (FIG. 4(b)).

A dry etching in accordance with an RIE (Reactive Ion Etching) process is applied with the use of the above-described mask 26 to remove unnecessary portions (only portions on which the mask is not formed) relating to the p-InGaAs film 25 to be a contact layer 15, the p-InP film 24 to be the second clad layer 14, the i-InP film 23 to be the first clad layer 13, the InGaAsP/InGaAsP-1.55 μm film 22 to be a light emitting layer 12 and the n-InP film 21 to be a buffer layer 11, to prepare a high-mesa structure in the cross-sectional shape (FIG. 5(a)). In FIG. 5(a), the etching step reaches the surface of the substrate 10 to remove the portion, thus showing the bottom surface 10c provided by the etching in the figure.

Then, an embedding process with BCB is applied to the areas in which the portions have been removed by the etching, to prepare an embedded layer 16 (FIG. 5(b)), and the mask 26 just above the contact layer 15 is removed by an organic solvent and an ashing process (FIG. 1(b) and FIG. 1(c)).

Then, a Ti/Pt/Au layer, which is not shown and to be an external electrode for applying a forward bias across a PN junction, is formed on the contact layer 15 by an electron beam evaporation process. Incidentally, the Ti/Pt/Au layer may be selectively formed only on the contact layer 15, or may be formed on the whole of the substrate 10 on the contact layer 15 and the embedded layer 16. In case where the Ti/Pt/Au layer is selectively formed only on the contact layer 15, it is preferable to form the Ti/Pt/Au layer on the whole of the substrate 10 on the contact layer 15 and the embedded layer 16, because of increase in number of manufacturing steps for a patterning process.

Then, the rear surface of the substrate 10 on which any optical waveguide is not formed, is polished, and the Ti/Pt/Au layer, which is not shown and to be the external electrode for applying the forward bias across the PN junction, is formed on the whole of the rear surface of the substrate 10 by then electron beam evaporation process.

Next, the substrate 10 on which the plurality of semiconductor laser 100 elements are formed, is cleaved along boundaries of the semiconductor laser 100 elements, thus permitting to obtain the semiconductor laser 100 element having the structure as shown in FIG. 1. Such a cleavage step forms the rear end surface of the semiconductor laser 100 element (the end surface 10a of the substrate 10, the reflection surface of the rear small-width waveguide 1) and the front end surface thereof (the other end surface 10b of the substrate 10, the radiation surface of the front small-width waveguide 2), respectively.

Lastly, a low reflection protection film is formed on the front end surface and a high reflection film is formed on the rear end surface, thus terminating the manufacture of the semiconductor laser 100 element.

In the manufacturing method according to the embodiment of the present invention, the MOVPE process is used as a crystal growth process. However, the present invention is not limited only to this process, and the present invention may be applied for example in a MBE (Molecular Beam Epitaxy) process.

In the manufacturing method according to the embodiment of the present invention, the RIE process is used as an etching process, but the present invention may be applied in an ICP (Inductively Coupled Plasma) process or a wet etching process. In addition, in the manufacturing method according to the embodiment of the present invention, the stepper is used in a photolithography process. However, the present invention is not limited only to this process, and the present invention may be applied for example in an electron beam exposure device.

Now, description will be given below of function and effect provided by providing the multi-mode interference optical waveguide 3 with the front port 3b (the front small-width waveguide 2) so that the central line $X_2$ of the front port 3b (the front small-width waveguide 2) of the multi-mode interference optical waveguide 3 is eccentrically placed relative to the central line $X_0$ of the multi-mode interference optical waveguide 3, in the semiconductor laser 100 according to the embodiment of the present invention.

As Comparative Example No. 1 relative to the semiconductor laser 100 according to the embodiment of the present invention, there will be exemplified a semiconductor laser having a ridge structure in which the central line $X_2$ of the front port 3b (the front small-width waveguide 2) of the 3×1 multi-mode interference optical waveguide 3 is coincident with the central line $X_0$ of the 3×1 multi-mode interference optical waveguide 3, as shown in FIG. 6(a).

Figure 7A:
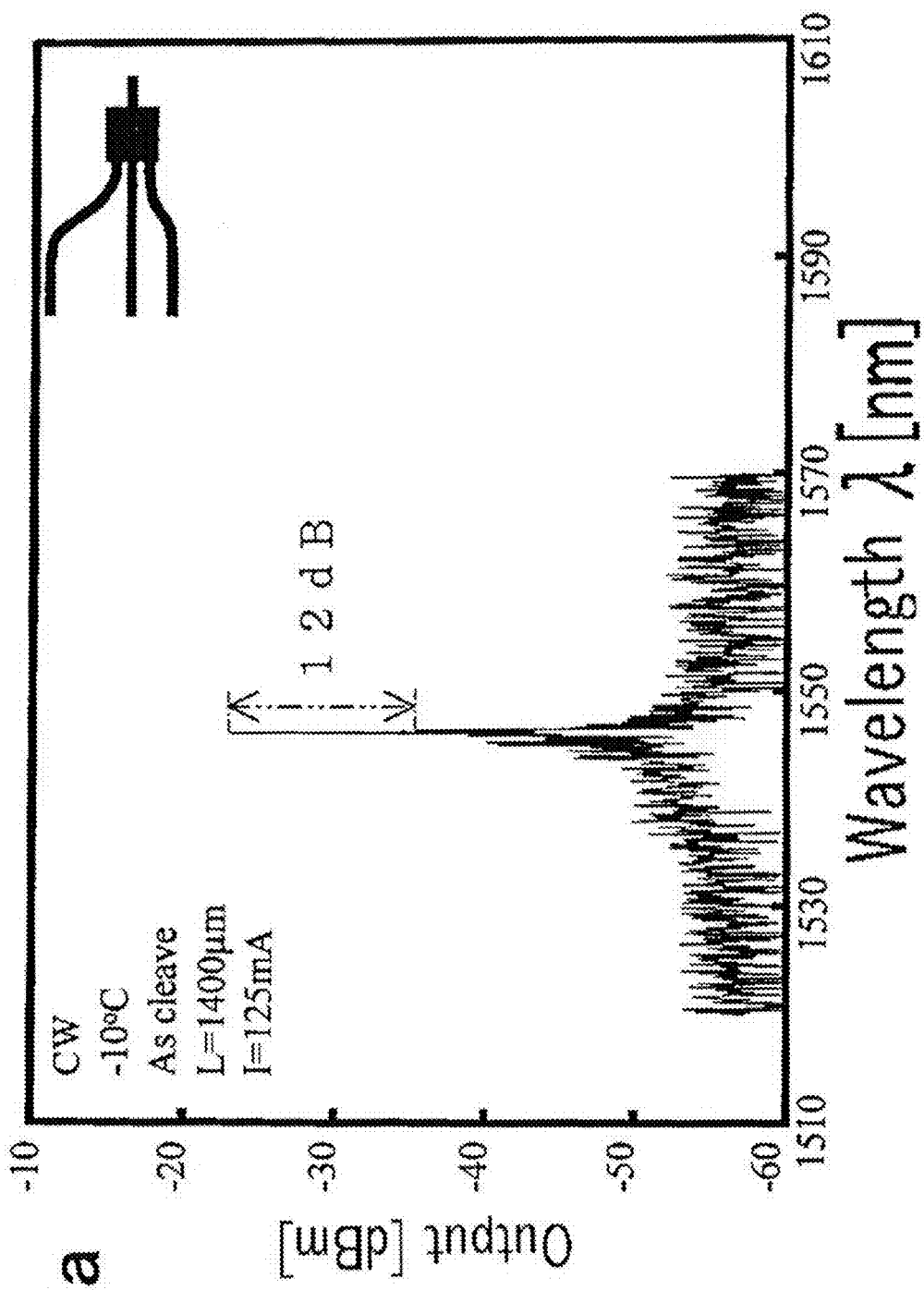
FIG. 7 (a) is a transmission spectrum by the semiconductor laser as shown in FIG. 6(a), (b) is a transmission spectrum by the semiconductor laser as shown in FIG. 1(a), and (c) is a transmission spectrum by the semiconductor laser as shown in FIG. 6(b)

In Comparative Example No. 1, the end surface of the semiconductor laser 100 element having the total length L of 1400 μm was formed by a cleavage, an injection current I was set as 125 mA under conditions of −10° C., a wavelength λ of the main interference light (the fundamental mode light) is set as 1550 nm, and a CW (Continuous Wave) was oscillated, and a light emitting spectrum was measured. The Side Mode Suppression Ratio (SMSR) was 12 dB as shown in FIG. 7(a).

Figure 7B:
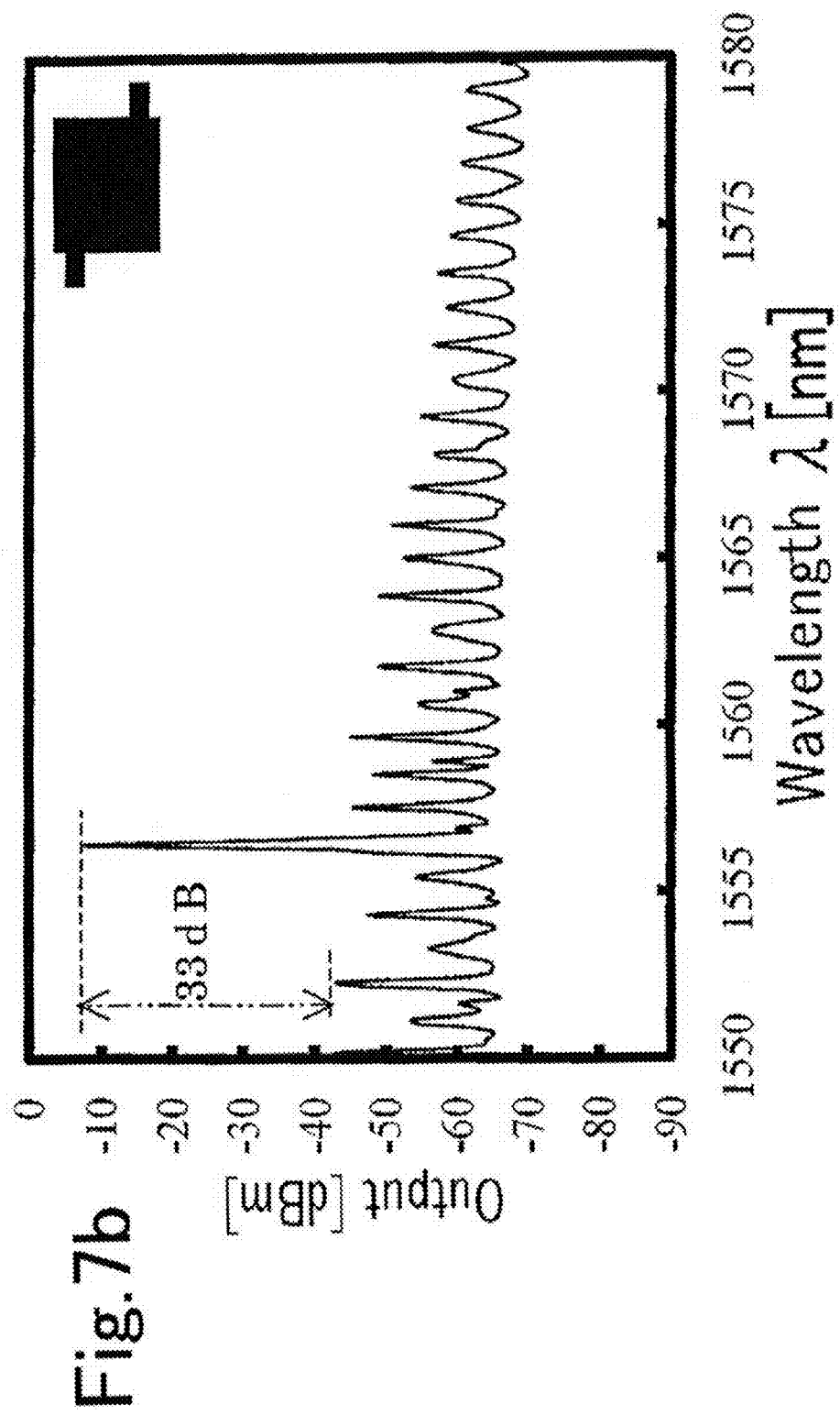

To the contrary, in the semiconductor laser 100 according to the embodiment of the present invention, the Side Mode Suppression Ratio (SMSR) was 33 dB, as shown in FIG. 7(b), thus providing function and effect of achieving a good single mode operation.

Figure 7C:
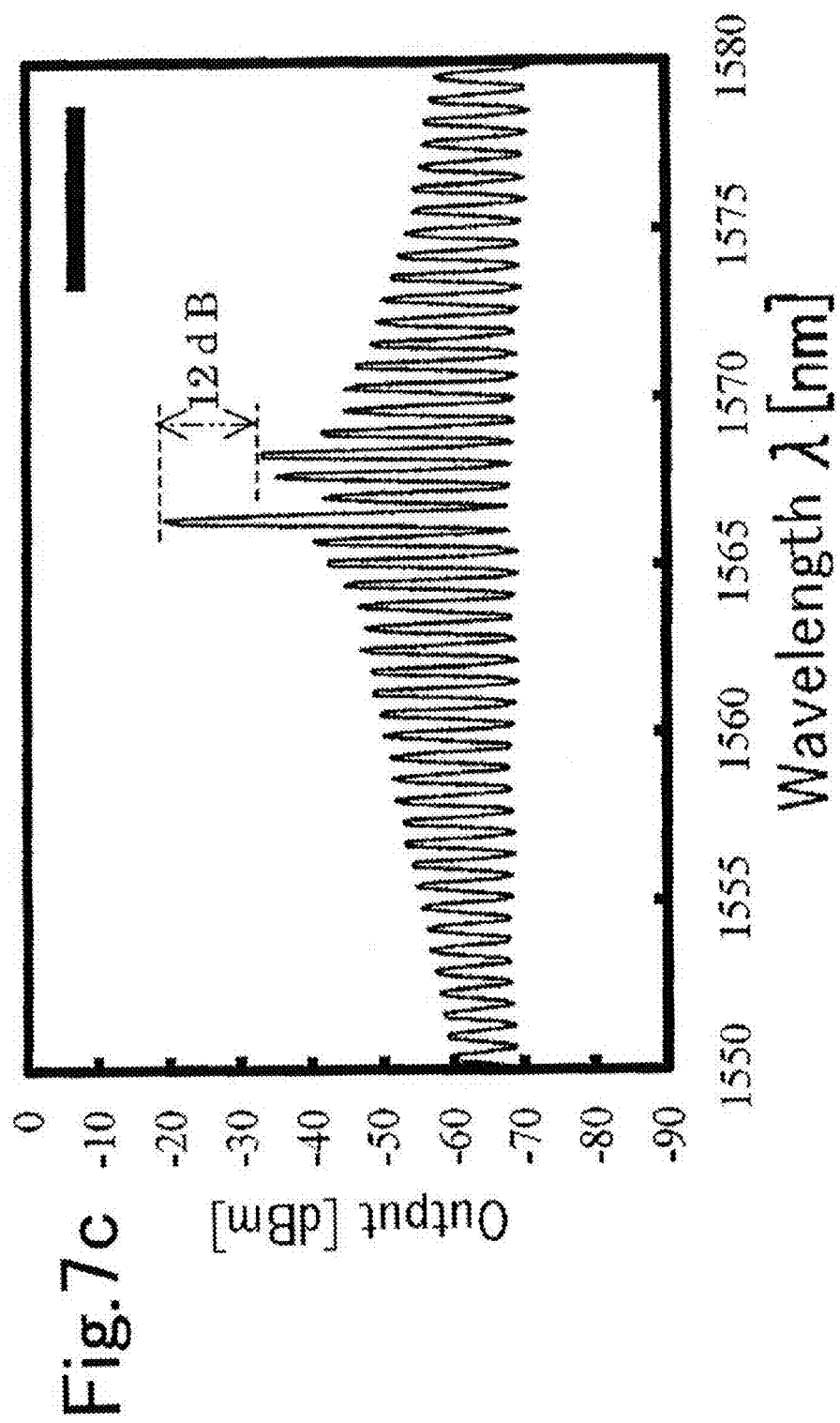

In case of the semiconductor laser, which includes only the single mode waveguide having a high-mesa structure as shown in FIG. 6(b), the Side Mode Suppression Ratio (SMSR) is 12 dB as shown in FIG. 7(c). Especially, in the semiconductor laser, which includes only the single mode waveguide, the waveguide width of the single mode waveguide is small in comparison with the waveguide width $W_1$ of the multi-mode interference optical waveguide 3 and cannot inject a high electric current, thus being difficult in achieving a high-output of the semiconductor laser.

To the contrary, in the semiconductor laser 100 according to the embodiment of the present invention, the provision of the asymmetric MMI 3 having the active layer in the entire area permits the asymmetric MMI 3 to function as the light emitting area, thus providing function and effect of achieving a high-output of the semiconductor laser, and the Side Mode Suppression Ratio (SMSR) of 30 dB or more, thus providing function and effect of satisfying a single wavelength property for communication. In assessment of the semiconductor laser 100 according to the embodiment of the present invention in quantum efficiency as an index of the semiconductor laser, the similar quantum efficiency to the normal semiconductor laser was obtained.

Now, there will be made a test of an acceptable range of an eccentricity d of the central line $X_2$, which relative to the central line $X_0$ of the multi-mode interference optical waveguide 3.

First, in case of the waveguide width $W_1$ of the multi-mode interference optical waveguide 3 as indicated in Table 1 below of 7.4 μm, 10 μm or 15 μm, the maximum transmittance of the semiconductor laser 100 was calculated in each case, while varying the eccentricity d (see Table 2 below).

TABLE 1

| Multi-Mode Interference Optical Waveguide 3 | | |
|---|---|---|
| Waveguide Width $W_1$ [μm] | Effective Waveguide Width $W_e$ [μm] | Waveguide Length $L_{MMI}$ [μm] |
| 7.4 | 7.6 | 158 |
| 10 | 10.2 | 285 |
| 15 | 15.2 | 635 |

TABLE 2

In case of Waveguide Width $W_1$ = 7.4 μm

| | Amount of Eccentricity d [μm] | | | | | | |
|---|---|---|---|---|---|---|---|
| | 0.86 | 0.96 | 1.06 | 1.26 | 1.46 | 1.56 | 1.66 |
| Maximum Transmittance | 0.65 | 0.76 | 0.87 | 0.98 | 0.86 | 0.74 | 0.64 |

In case of Waveguide Width $W_1$ = 10 μm

| | Amount of Eccentricity d [μm] | | | | | | |
|---|---|---|---|---|---|---|---|
| | 1.3 | 1.4 | 1.5 | 1.7 | 1.9 | 2.0 | 2.1 |
| Maximum Transmittance | 0.65 | 0.76 | 0.86 | 0.97 | 0.79 | 0.74 | 0.64 |

In case of Waveguide Width $W_1$ = 15 μm

| | Amount of Eccentricity d [μm] | | | | | | |
|---|---|---|---|---|---|---|---|
| | 2.13 | 2.23 | 2.33 | 2.53 | 2.73 | 2.83 | 2.93 |
| Maximum Transmittance | 0.63 | 0.72 | 0.82 | 0.92 | 0.82 | 0.71 | 0.61 |

The present inventor has taken particular note of a relationship between the amount of eccentricity d and the effective waveguide width $W_e$ of the multi-mode interference optical waveguide 3, based on the results as shown in Table 2, and derived a theoretical equation of the optimum amount of eccentricity d providing the maximum transmittance (hereinafter referred to as the "reference amount of eccentricity $d_0$" (see Equation (5)).

$$d_0 = W_e/6 \qquad \text{Equation (5)}$$

The respective table sections in case where the waveguide width $W_1$ of the multi-mode interference optical waveguide 3 as shown in Table 2 is 7.4 μm, 10 μm or 15 μm based on Equation (5) are combined into a single table (see Table 3) and a relationship between the difference from the reference amount of eccentricity $d_0$ and the transmittance of the semiconductor laser is indicated as shown in FIG. 3(b).

TABLE 3

| Amount of Eccentricity d [μm] | Difference from Reference amount of Eccentricity $d_0$ | Maximum Transmittance | | |
|---|---|---|---|---|
| | | In case of $W_1$ = 7.4 μm | In case of $W_1$ = 10 μm | In case of $W_1$ = 15 μm |
| $W_e/6 - 0.4$ | −0.4 | 0.65 | 0.65 | 0.63 |
| $W_e/6 - 0.3$ | −0.3 | 0.76 | 0.75 | 0.72 |
| $W_e/6 - 0.2$ | −0.2 | 0.87 | 0.86 | 0.82 |
| $W_e/6$ | 0 | 0.98 | 0.97 | 0.92 |
| $W_e/6 + 0.2$ | +0.2 | 0.86 | 0.79 | 0.82 |
| $W_e/6 + 0.3$ | +0.3 | 0.74 | 0.74 | 0.71 |
| $W_e/6 + 0.4$ | +0.4 | 0.64 | 0.64 | 0.61 |

Here, in case of a theoretical wave transmittance of 0.7 or more, the Side Mode Suppression Ratio (SMSR) that satisfies a single wavelength property for communication becomes 30 dB or more. It is therefore recognized that the optimum range (an acceptable range) of the amount of eccentricity d is within ±0.3 μm as a standard of ⅙ of the effective waveguide width $W_e$ of the multi-mode interference optical waveguide 3, based on Table 3 and FIG. 3(b).

Figure 8A:
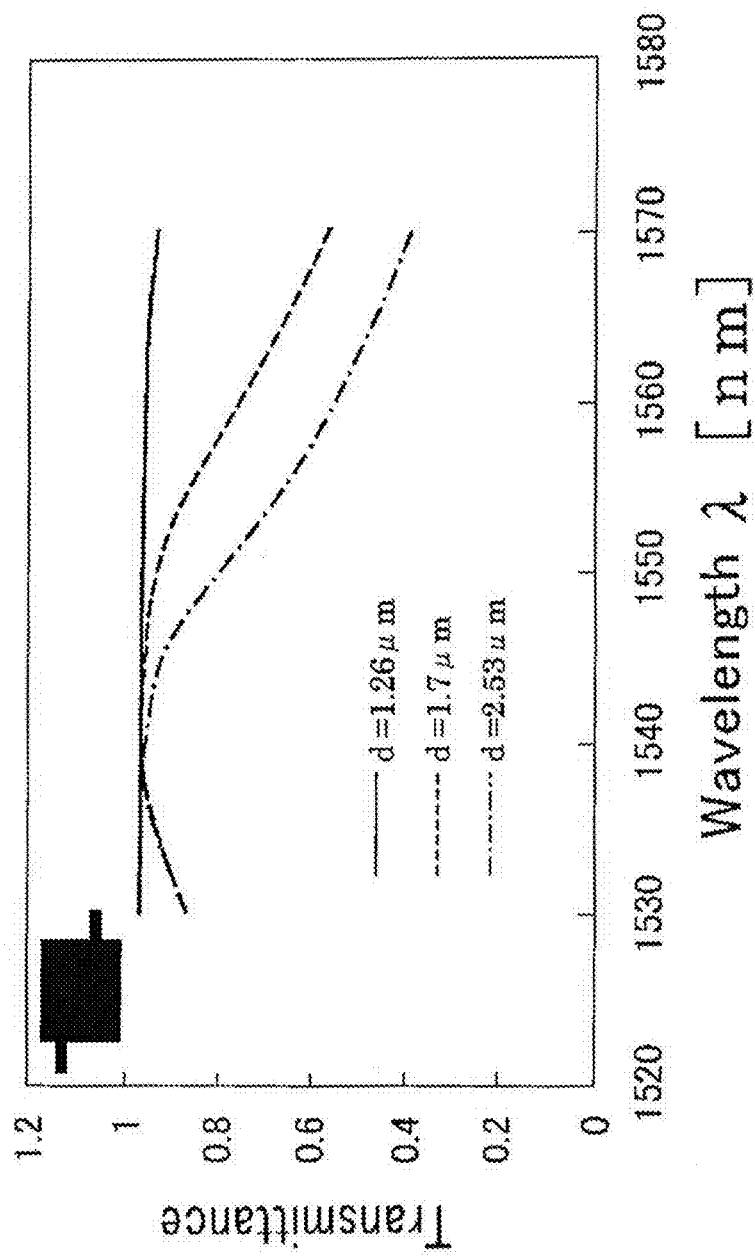
FIG. 8 (a) is a graph showing a wavelength transmission property of the semiconductor laser as shown in FIG. 1(a), and (b) is a wavelength transmission property of the semiconductor laser as shown in FIG. 6(c)

In addition, it is recognized by making a test of the wavelength transmission property of the semiconductor laser 100 in case of the amount of eccentricity d of 1.26 μm, 1.7 μm or 2.53 μM, that an increase in the amount of eccentricity d leads to a stronger wavelength-dependence, as shown in FIG. 8(a). More specifically, it is recognized that it is preferable to increase the amount of eccentricity d in order to obtain a wavelength stability that satisfies a single wavelength property for communication, with absence of limitation in size of the multi-mode interference optical waveguide 3.

Figure 8B:
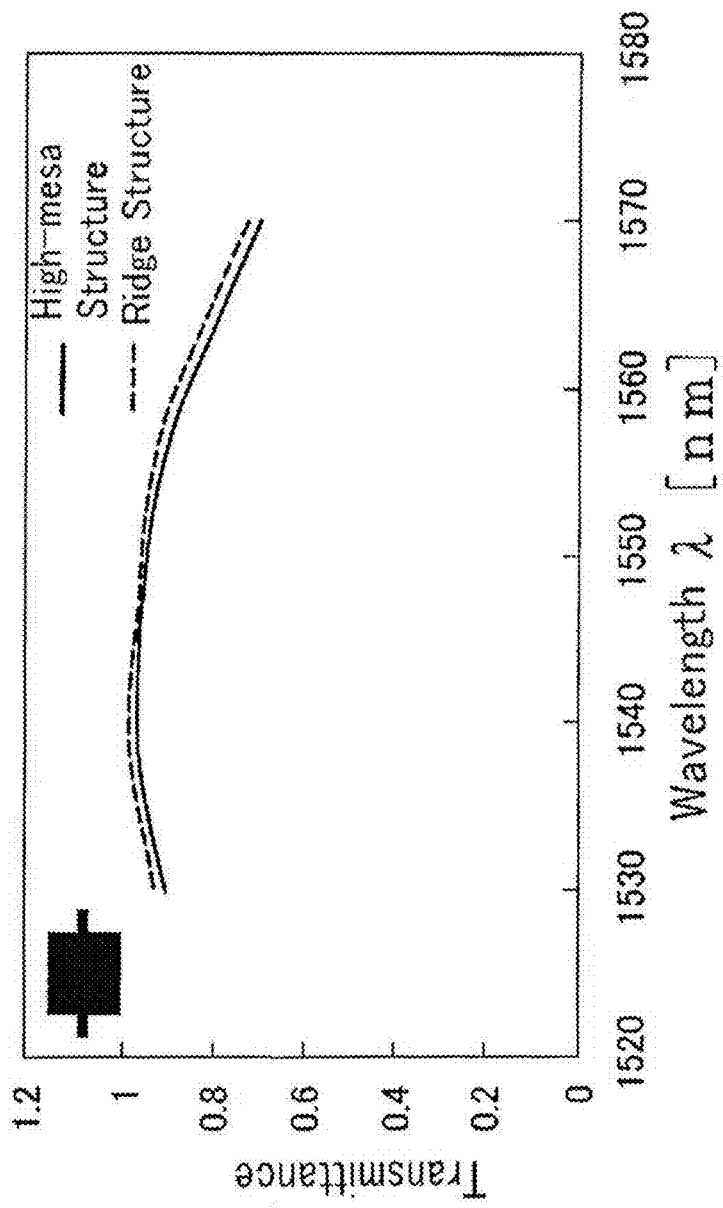

Incidentally, it is recognized by making a test of the wavelength transmission property of the semiconductor laser in case of a multi-mode interference optical waveguide in which the central line $X_0$ of the multi-mode interference optical waveguide 3 is coincident with the central line $X_1$ of the rear port 3a and the central line $X_2$ of the front port 3b (hereinafter referred to as the "symmetric MMI"), as shown in FIG. 6(c), but the symmetric MMI having a high-mesa structure or the symmetric MMI having a ridge structure, that the transmittance of the semiconductor laser in the symmetric MMI having the high-mesa structure is slightly high in comparison with the symmetric MMI having the ridge structure, as shown in FIG. 8(b).

The semiconductor laser 100 according to the embodiment of the present invention provides function and effect of providing a mechanism as included to select a single wavelength, irrespective of non-existence of any grating, thus obtaining oscillation with a single wavelength. Especially, the semiconductor laser 100 according to the embodiment of the present invention provides function and effect of providing simplification of the manufacturing process and achieving a light source at low cost, in comparison with a conventional semiconductor laser such as a DFB-LD (a distributed-feedback laser diode) utilizing a grating.

In addition, the semiconductor laser 100 according to the embodiment of the present invention is provided with the 1×1 asymmetric MMI 3, thus making it possible to provide function and effect of achieving the Side Mode Suppression Ratio (SMSR) of 33 dB that satisfies a single wavelength property for communication and exceeds 30 dB or more, and achieving a good single mode operation.

The reference amount of eccentricity $d_0$ (the optimum amount of eccentricity d providing the maximum transmittance) and the optimum range (an acceptable range) of the amount of eccentricity d according to the embodiment of the present invention have been described as in case where the wave length λ of the main interference light (the fundamental mode light) is 1550 nm. However, it does not depend on the wave length λ of the main interference light (the fundamental mode light). More specifically, the reference amount of eccentricity $d_0$ is one-sixth of the effective waveguide width $W_e$ of the multi-mode interference optical waveguide 3 and the optimum range (an acceptable range) of the amount of eccentricity d is within ±0.3 μm as a standard of ⅙ of the effective waveguide width $W_e$ of the multi-mode interference optical waveguide 3. When the wave length λ of the main interference light (the fundamental mode light) in the waveguide length $L_{MMI}$ of the multi-mode interference optical waveguide 3 is set for example as 850 nm, it become about 1.82 times of the waveguide length $L_{MMI}$ (=1550 nm/850 nm) in case of the wave length λ of the main interference light (the fundamental mode light) of 1550 nm.

Second Embodiment of the Present Invention

Figure 9A:
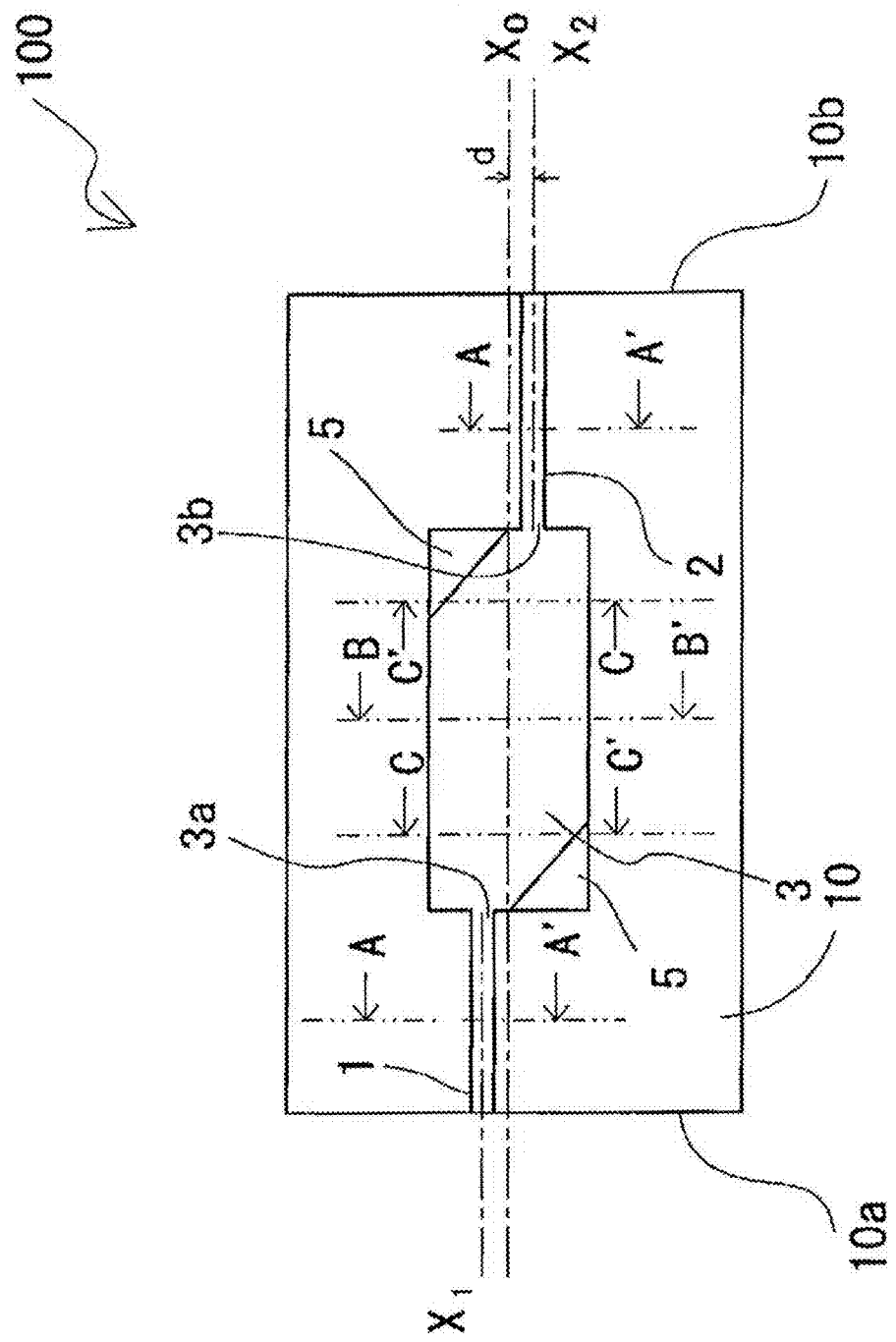
FIG. 9 (a) is a plan view illustrating an example of a schematic structure of the semiconductor laser according to the second embodiment of the present invention, (b) is a cross-sectional view cut along the line C-C' of the semiconductor laser as shown in FIG. 9(a), and (c) is another cross-sectional view cut along the line C-C' of the semiconductor laser as shown in FIG. 9(a)

FIG. 9(a) is a plan view illustrating an example of a schematic structure of the semiconductor laser according to the second embodiment of the present invention, FIG. 9 (b) is a cross-sectional view cut along the line C-C' of the semiconductor laser as shown in FIG. 9(a), and FIG. 9 (c) is another cross-sectional view cut along the line C-C' of the semiconductor laser as shown in FIG. 9(a). The same reference numerals in FIG. 9 as those used in FIG. 1 to FIG. 8 show the same or corresponding components and the description of them will be omitted.

The multi-mode interference optical waveguide 3 according to the embodiment of the present invention is provided with a light absorption unit 5, which absorbs a high-order mode light or a stray light, in a non-imaging region 4b excepting a imaging point 4a in an imaginary face 4 (an active layer (an light emitting layer 12) including the imaging point 4a at which a fundamental mode light or a signal light forms the image), which is perpendicular to a waveguide direction, as shown in FIG. 9(b). The imaginary face 4 means a face, which is perpendicular to the waveguide direction and provides an imaging position (the imaging point 4a) at which an optical field that is the same as the incident light periodically appears as a result of an optical interference, for example as shown in FIG. 2(a).

The light absorption unit 5 may be configured by providing, for example, the multi-mode interference optical waveguide 3 with a recess 5a extending from the upper surface to the lower surface (the buffer layer 11 or the substrate 10) of the active layer (the light emitting layer 12) in response to the non-imaging region 4b, and by placing a light absorption body in which carbon black is mixed into a silicone resin as a matrix, in the above-mentioned recess 5a. Such a structure enables the light absorption unit 5 to absorb the high-order mode light (the stray light) to decrease a ratio of emission of the high-order mode light (the stray light) from the front port 3b.

In the optical field in which an optical intensity of the fundamental mode light having the main interference light wavelength λ for example of 1550 nm is simulated, in the 1×1 multi-mode interference optical waveguide 3 according to the first embodiment of the present invention, which does not include a light absorption unit 5, the imaging point 4a and the non-imaging region 4b appear at each predetermined distance from the end surface on the side of the rear port 3a of the 1×1 multi-mode interference optical waveguide 3, as shown in FIG. 2(a).

In view of this, in the embodiment of the present invention, the light absorption unit 5 is provided, based on the optical field as shown in FIG. 2(a), in a planar shape, which may be accommodated in a region of the non-imaging region 4b, corresponding to the non-imaging region 4b placed in the vicinity of the rear port 3a and the front port 3b of the 1×1 multi-mode interference optical waveguide 3, as shown in FIG. 9(a).

The place at which the light absorption unit 5 is to be provided, is not limited only to the non-imaging region 4b placed in the vicinity of the rear ort 3a and the front port 3b of the 1×1 multi-mode interference optical waveguide 3, provided that it is a place where an effective light absorption unit 5 may be formed and is located in the non-imaging region 4b.

The light absorption unit 5 has been described as being constituted by placing the light absorption body in which the carbon black is mixed into the silicone resin as a matrix, in the recess 5a. However, it is conceivable to apply a configuration in which the contact layer 15 corresponding to the non-imaging area 4b is made inoperable (by forming an electric isolation groove 5b) so as not to apply a forward bias across the PN junction corresponding to the non-imaging region 4b, so that a region corresponding to the non-imaging region 4b in the multi-mode interference optical waveguide 3 may serve as a light absorption unit (a saturable absorption region).

Now, description will be given below of a method for manufacturing the semiconductor laser 100 provided with the multi-mode interference optical waveguide 3 having the electric isolation groove 5b, with reference to FIG. 9(c). The method for manufacturing the semiconductor laser 100 is the same as the method for manufacturing the semiconductor laser 100 according to the first embodiment of the present invention in the steps of preparing the embedded layer 16 (FIG. 5(b)), and removing the mask 26 just above the contact layer 15 by the organic solvent and the ashing process (FIG. 1(b) and FIG. 1(c)), and the description of these steps will be omitted.

Figure 9C:
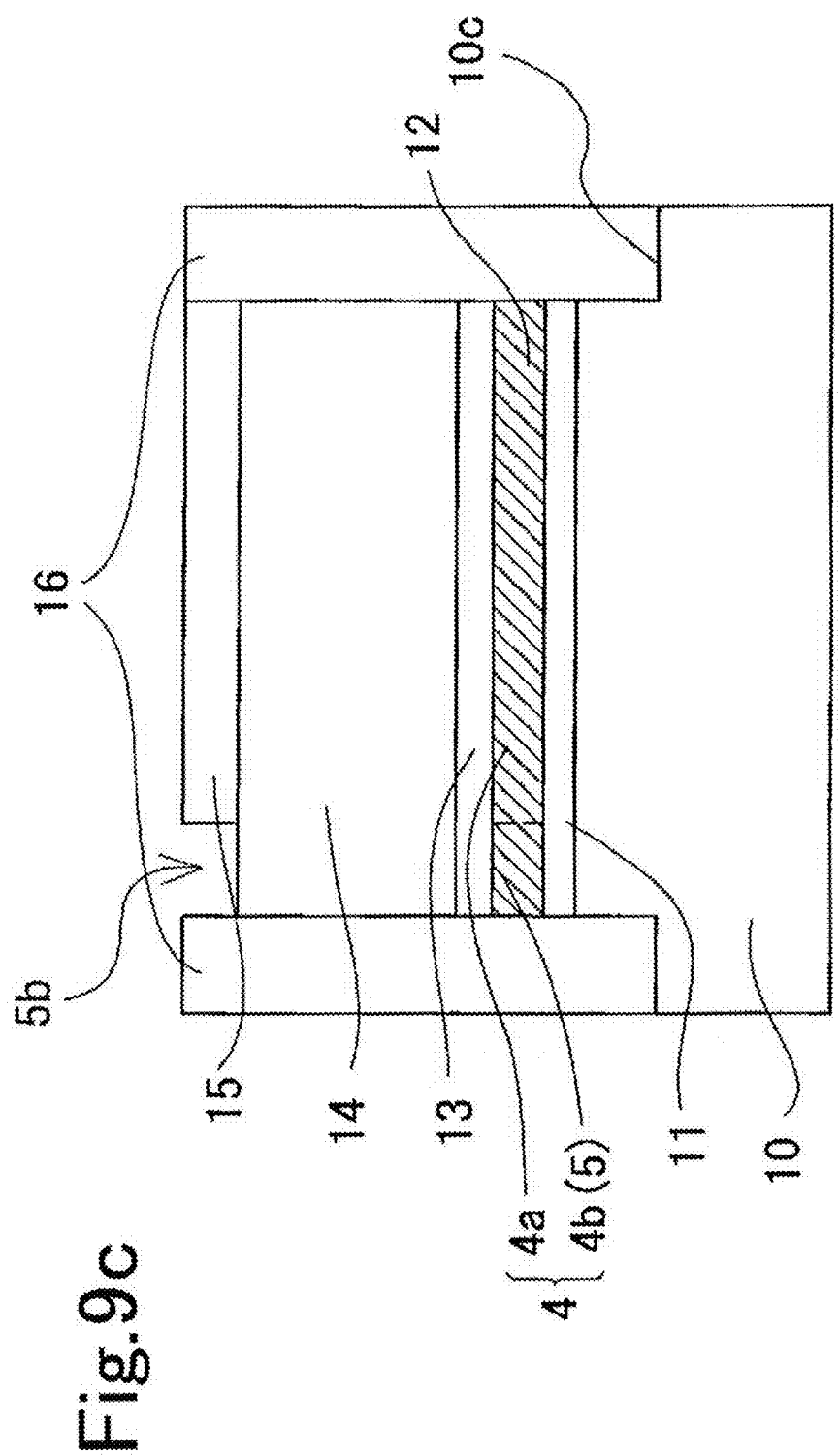

A region, which is to be the electric isolation groove 5b, in the contact layer 15, which has been exposed after removal of the mask 26, is removed by a wet etching process, to prepare the electric isolation groove 5b (FIG. 9(c)). Then, a Ti/Pt/Au layer, which is not shown and to be an external electrode to apply a forward bias across a PN connection, is formed on the contact layer 15 by an electron beam evaporation process.

Then, the rear surface of the substrate 10 on which any optical waveguide is not formed, is polished, and the Ti/Pt/Au layer, which is not shown and to be the external electrode for applying the forward bias across the PN junction, is formed on the whole of the rear surface of the substrate 10 by then electron beam evaporation process.

Next, the substrate 10 on which the plurality of semiconductor laser 100 elements are formed, is cleaved along boundaries of the semiconductor laser 100 elements, thus permitting to obtain the semiconductor laser 100 element having the structure as shown in FIG. 9(a) and FIG. 9(b). Lastly, a low reflection protection film is formed on the front end surface and a high reflection film is formed on the rear end surface, thus terminating the manufacture of the semiconductor laser 100 element.

The second embodiment of the present invention differs from the first embodiment of the present invention only in the light absorption unit 5 as newly provided in the multi-mode interference optical waveguide 3. The same function and effect as the first embodiment of the present invention may be provided excepting function and effect by the light absorption unit 5 described below.

The light absorption unit 5 provides function and effect of absorbing the high-order mode light to decrease a ratio of emission of the high-order mode light from the front port 3b of the multi-mode interference optical waveguide 3, thus providing a higher Side Mode Suppression Ratio (SMSR).

Third Embodiment of the Present Invention

Figure 10B:
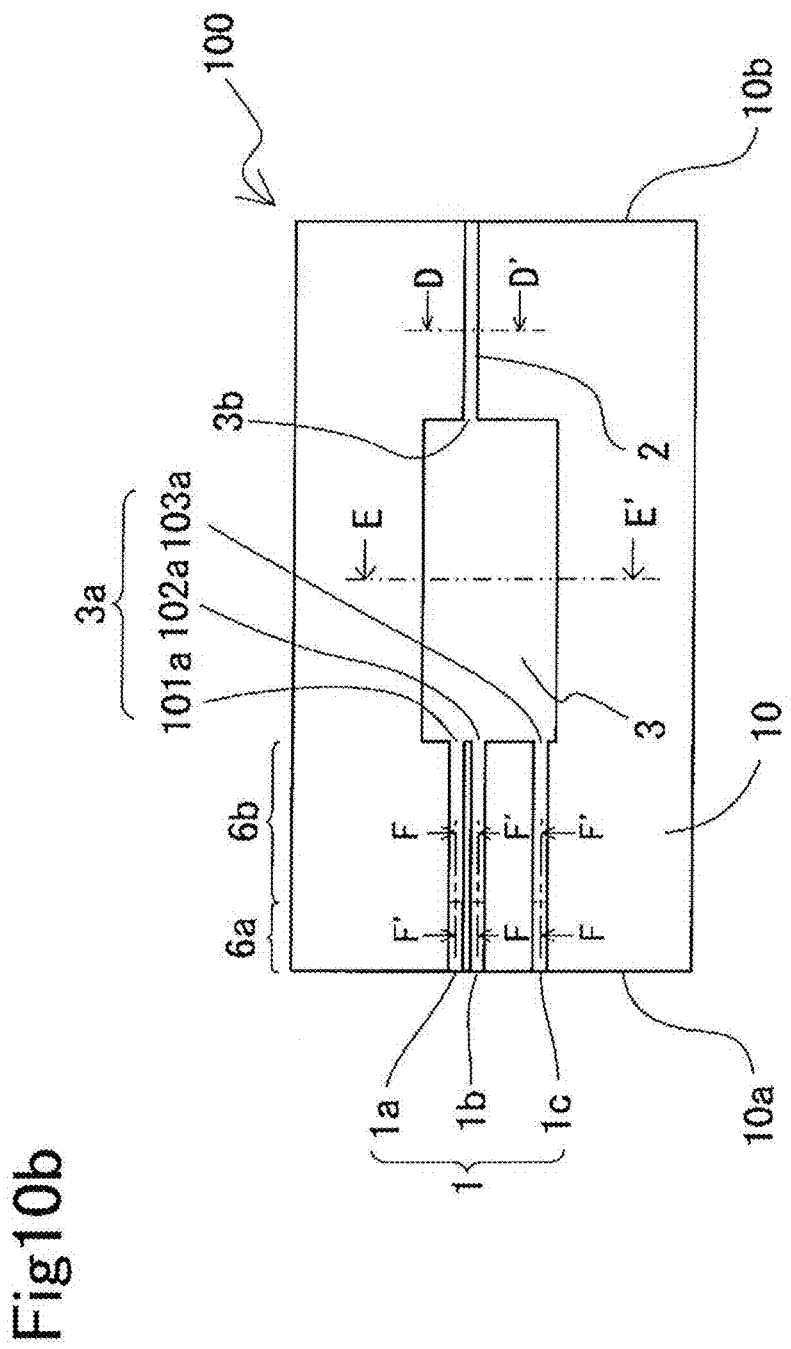
FIG. 10 (a) is a plan view illustrating an example of a schematic structure of the semiconductor laser provided with a 3×1 multi-mode interference optical waveguide according to the third embodiment of the present invention, and (b) is a plan view illustrating another example of the schematic structure of the semiconductor laser provided with the 3×1 multi-mode interference optical waveguide according to the third embodiment of the present invention.
Figure 11A:
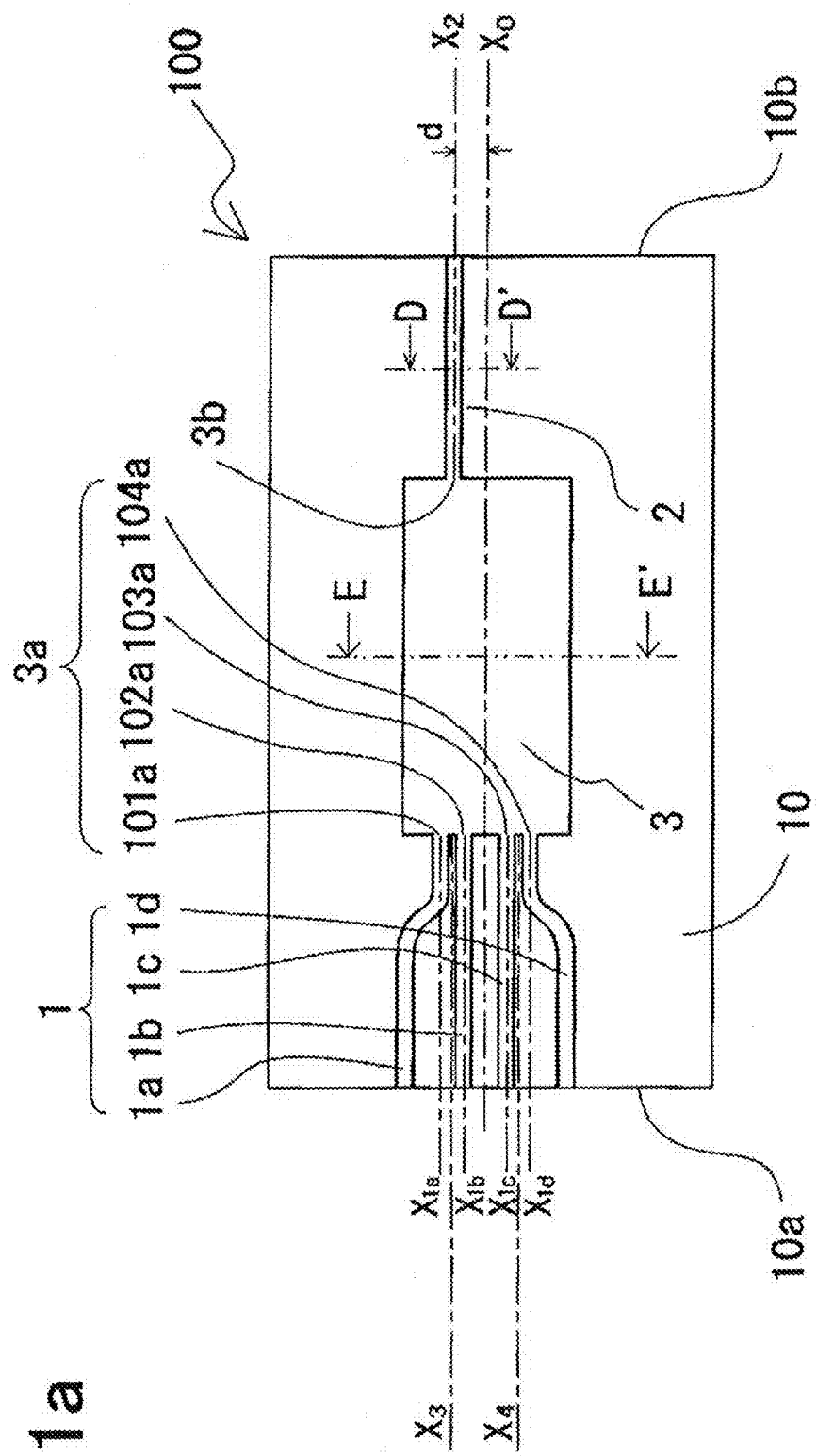
FIG. 11 (a) is a plan view illustrating an example of a schematic structure of the semiconductor laser provided with a 4×1 multi-mode interference optical waveguide according to the third embodiment of the present invention, and (b) is a plan view illustrating another example of the schematic structure of the semiconductor laser provided with the 4×1 multi-mode interference optical waveguide according to the third embodiment of the present invention.
Figure 13A:
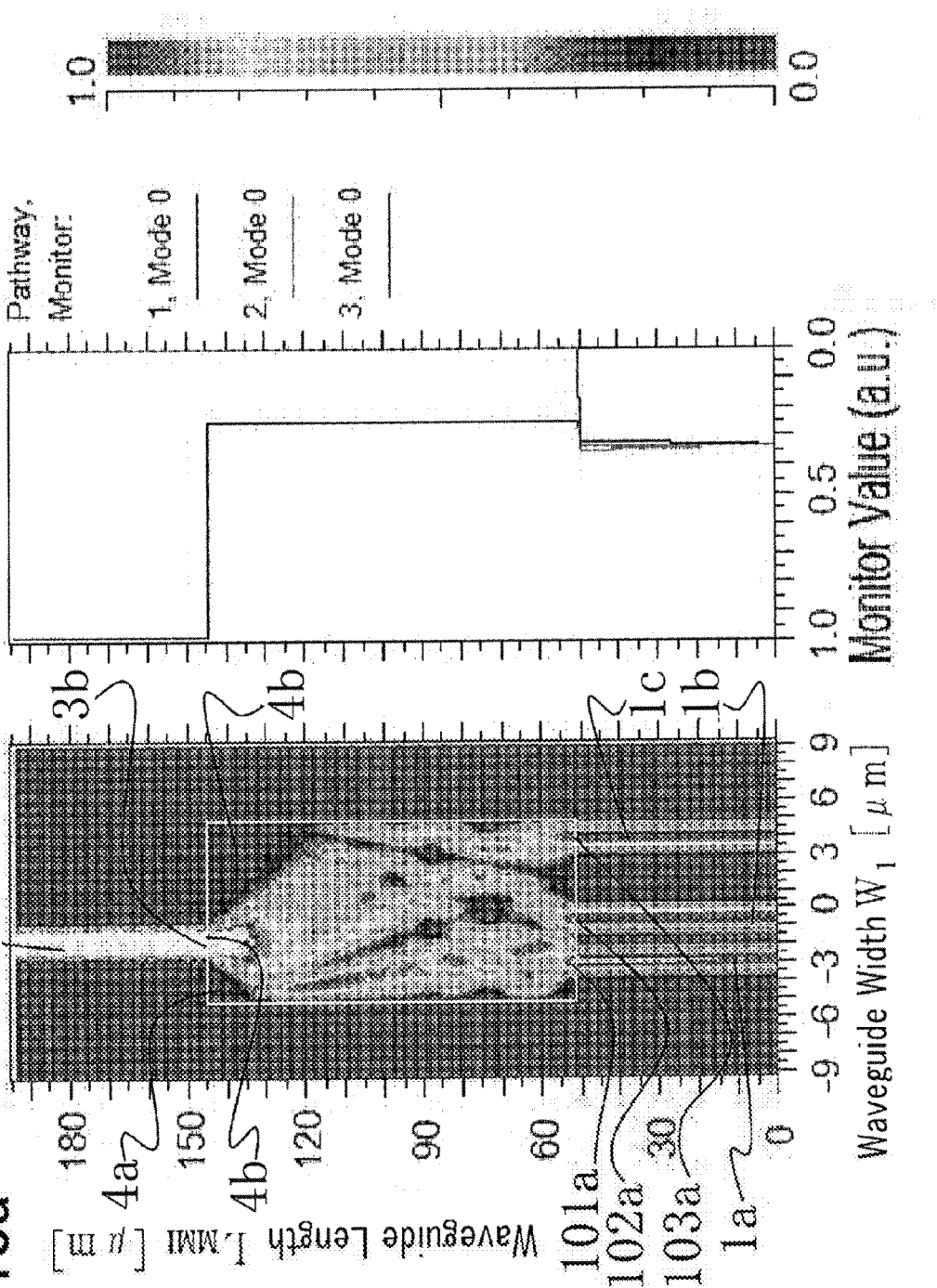
Figure 13B:
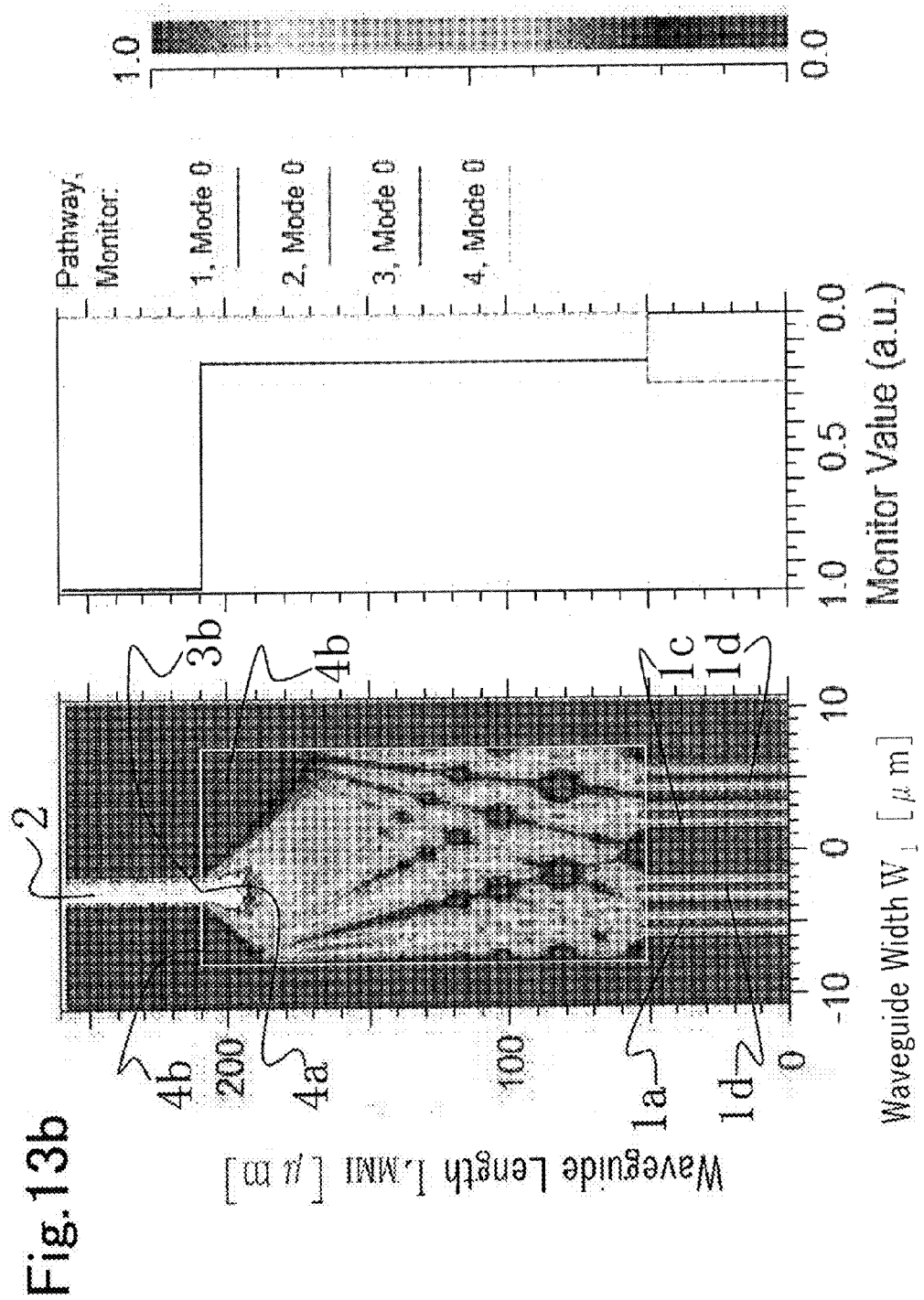

FIG. 10(a) is a plan view illustrating an example of a schematic structure of the semiconductor laser provided with a 3×1 multi-mode interference optical waveguide according to the third embodiment of the present invention, and FIG. 10(b) is a plan view illustrating another example of the schematic structure of the semiconductor laser provided with the 3×1 multi-mode interference optical waveguide according to the third embodiment of the present invention. FIG. 11(a) is a plan view illustrating an example of a schematic structure of the semiconductor laser provided with a 4×1 multi-mode interference optical waveguide according to the third embodiment of the present invention, and FIG. 11(b) is a plan view illustrating another example of the schematic structure of the semiconductor laser provided with the 4×1 multi-mode interference optical waveguide according to the third embodiment of the present invention. FIG. 12(a) is a cross-sectional view cut along the line D-D' of the semiconductor laser as shown in FIG. 10(b) and FIG. 11(b), FIG. 12(b) is a cross-sectional view cut along the line E-E' of the semiconductor laser as shown in FIG. 10(b) and FIG. 11(b), and FIG. 12(c) is a cross-sectional view cut along the line F-F of the semiconductor laser as shown in FIG. 10(b) and FIG. 11(b). FIG. 13(a) is a descriptive view illustrating an optical field in which an optical intensity of a fundamental mode light having a main interference light wavelength λ of 1550 nm is simulated, in case where the waveguide length of the 3×1 multi-mode interference optical waveguide as shown in FIG. 10(a) is set as one-third of the beat length, and FIG. 13(b) is a descriptive view illustrating an optical field in which an optical intensity of a fundamental mode light having a main interference light wavelength λ of 1550 nm is simulated, in case where the waveguide length of the 4×1 multi-mode interference optical waveguide as shown in FIG. 11(a) is set as one-fourth of the beat length. FIG. 14 is a cross-sectional view corresponding to FIG. 12(c) for describing the method for manufacturing the semiconductor laser according to the third embodiment of the present invention. FIG. 15 is a cross-sectional view for describing the subsequent process of the method for manufacturing the semiconductor laser as shown in FIG. 14. The same reference numerals in FIG. 10 to FIG. 15 as those used in FIGS. 1 to 9 show the same or corresponding components and the description of them will be omitted. The cross-sectional views as shown in FIG. 12(c), FIG. 14 and FIG. 15 are cross-sectional view cut along the waveguide direction of the rear small-width waveguide 1 and the cross-sectional view as shown in FIG. 12(a) and FIG. 12(b) are cross-sectional view perpendicular to the waveguide direction of the front small-width waveguide 2 and the multi-mode interference optical waveguide 3, and their directions of the arrowed lines are different from each other.

In the above description of the semiconductor laser 100 according to the first embodiment of the present invention, the 1×1 multi-mode interference optical waveguide 3 in which M is 1, is described as an example, but the present invention is not limited only to such a 1×1 multi-mode interference optical waveguide 3. It may be, for example, the 3×1 multi-mode interference optical waveguide 3 in which M is 3, as shown in FIG. 10, or the 4×1 multi-mode interference optical waveguide 3 in which M is 4, as shown in FIG. 11.

Now, the description will be given below of the 3×1 multi-mode interference optical waveguide 3 with reference to FIG. 10. The front port 3b of the 3×1 multi-mode interference optical waveguide 3 is eccentrically placed so that a distance between the central line $X_2$ and the central line $X_0$ of the 3×1 multi-mode interference optical waveguide 3 becomes $W_e/6$, as described in the first embodiment of the present invention.

The rear port 3a of the 3×1 multi-mode interference optical waveguide 3 comprises two ports placed on the same side (the facing side) as the front port 3b (the first rear port 101a, the second rear port 102a), and one port placed on the different (the opposing corner) side from the front port 3b (the third rear port 103a), with reference to the central line $X_0$ of the 3×1 multi-mode interference optical waveguide 3.

The reference line (the first reference line $X_3$), which is placed in an intermediate position between the central line (the first reference line $X_{1a}$) of the first rear port 101a and the central line (the second reference line $X_{1b}$) of the second rear port 102a, is eccentrically placed by $W_e/6$ from the central line $X_0$ of the 3×1 multi-mode interference optical waveguide 3. The first rear port 101a and the second rear port 102a are placed respectively so that the first central line $X_{1a}$ and the second central line $X_{1b}$ are eccentrically placed by $W_e(3M)$ (wherein, M=3) relative to the first reference line $X_3$, and the distance between the first central line $X_{1a}$ and the second central line $X_{1b}$ becomes $2W_e/(3M)$ (wherein, M=3).

The third rear port 103a is eccentrically placed so that the distance between the central line (the third central line $X_{1c}$) and the nearest surface to the third rear port 103a of the 3×1 multi-mode interference optical waveguide 3 becomes $W_e/9$.

Here, the number of 4 corresponding to the 1×1 multi-mode interference optical waveguide 3 as described in the first embodiment of the present invention may be expanded by the following Equation (6) so as to correspond to the M×1 multi-mode interference optical waveguide 3.

$$L_{MMI}=L_\pi/M \text{ (}M\text{ being a positive integer)} \quad \text{Equation (6)}$$

As for a design example of the 3×1 multi-mode interference optical waveguide 3 according to the embodiment of the present invention, the waveguide width $W_{MMI}$ of the 3×1 multi-mode interference optical waveguide 3 is 10 μm, the waveguide length $L_{MMI}$ of the 3×1 multi-mode interference optical waveguide 3 is 94 μm, and the waveguide widths $W_a$ of the rear small-width waveguide 1 and the front small-width waveguide 2 are 1 μm.

When there was simulated an optical intensity of a fundamental mode light having a main interference light wavelength λ of 1550 nm, in the 3×1 asymmetric MMI 3 in which the waveguide length $L_{MMI}$ was set as one-third of the beat length $L_\pi$, the optical field as shown in FIG. 13(a) was obtained. More specifically, when the waveguide length $L_{MMI}$ of the 3×1 asymmetric MMI 3 is $L_\pi$ (the beat length)/M (wherein, M=3), as shown in FIG. 13(a), the fundamental mode light forms an image in a single area (the front port 3b) on the end surface on the side of the front port 3b of the asymmetric MMI 3, thus making it possible to enhance the transmittance of the fundamental mode light radiated from the single front port 3b.

The 3×1 multi-mode interference optical waveguide 3 may not oscillate as the semiconductor laser 100, unless there is not made a phase matching of the light (the end phase) incident on the rear port 3a (the first rear port 101a, the second rear port 102a and the third rear port 103a) (becoming a large threshold). As a result, the semiconductor laser 100 provided with the 3×1 multi-mode interference optical waveguide 3 enables the rear small-width waveguide 1 to function as the phase matching waveguide so as to shift the phase of the light incident on the first rear port 101a by π/3 [rad] and shift the phase of the light incident on the third rear port 103a by −π/3 [rad], relative to the phase of the light incident on the second rear port 102a (0 [rad]).

There is an example of the phase matching waveguide that matches the phase of the light incident on the first rear port 101a, the second rear port 102a and the third rear port 103a by designing the rear small-width waveguide 1 connected to the second rear port 102a (the second rear small-width waveguide 1b) as a linear waveguide, and designing the rear small-width waveguide 1 (the first rear small-width waveguide 1a) connected to the first rear port 101a and the rear small-width waveguide 1 (the third rear small-width waveguide 1c) connected to the third rear port 103a as a curved waveguide having a curved section, as shown in FIG. 10(a).

There is another example of the phase matching waveguide that matches the phase of the light incident on the first rear port 101a, the second rear port 102a and the third rear port 103a by removing a part of the contact layer 15 so as to traverse the longitudinal direction of the rear small-width waveguide 1 to divide the rear small-width waveguide 1 into two regions (a phase matching region 6a, and a waveguide region 6b), as shown in FIG. 10(b) and FIG. 12(c), and injecting different currents to the phase matching region 6a and the waveguide region 6b to vary a refraction index of a light emitting layer 12.

Now, the description will be given below of a method for manufacturing the semiconductor laser 100 provided with the phase matching region 6a and the waveguide region 6b as the other example of the phase matching waveguide, with reference to FIG. 14 and FIG. 15. The method for manufacturing the semiconductor laser 100 is the same as the method for manufacturing the semiconductor laser 100 according to the first embodiment of the present invention in the steps of preparing the embedded layer 16 (FIG. 5(b)), and removing the mask 26 just above the contact layer 15 by the organic solvent and the ashing process (FIG. 1(b) and FIG. 1(c)), and the description of these steps will be omitted.

Photoresist is applied on the contact layer 15 and the embedded layer 16, which have been exposed after removal of the mask 26, and a photolithography process by a stepper is conducted to form a mask 27 for etching on the contact layer 15 and the embedded layer 16 so as to be matched with a planar shape of the regions excepting a boundary between the phase matching region 6a and the waveguide region 6b (in a width of about 4 μm to 10 μm), as shown in FIG. 10(b) (FIG. 14(a)).

A wet etching process utilizing a sulfuric acid chemicals is applied with the use of the mask 27 to remove unnecessary portions on the contact layer 15 at the boundary between the phase matching region 6a and the waveguide region 6b (FIG. 14(b)).

Figure 14C:
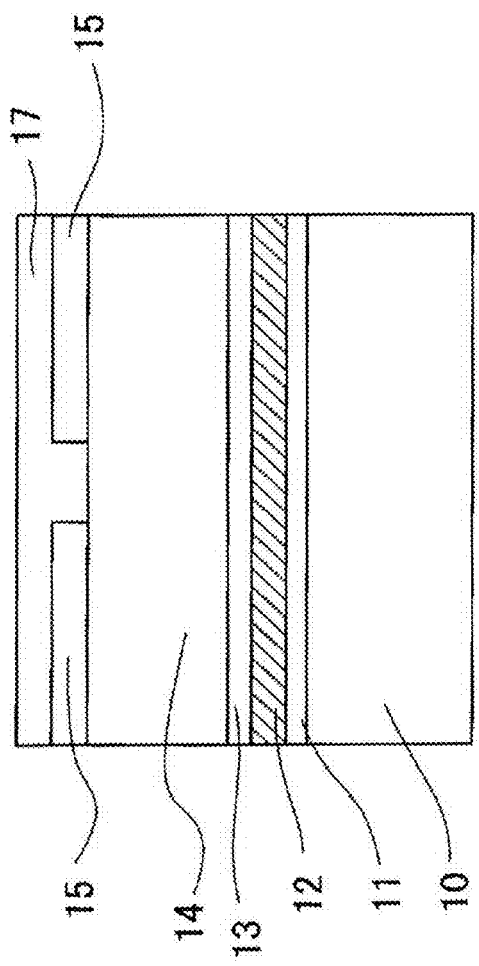
FIG. 14 is a cross-sectional view corresponding to FIG. 12(c) for describing the method for manufacturing the semiconductor laser according to the third embodiment of the present invention.

Then, the mask 27 on the contact layer 15 is removed by an organic solvent and an ashing process and then an $SiO_2$ film 17 is deposited on the second clad layer 14 and the contact layer 15, as exposed by a thermal CVD (Chemical Vapor Deposition) process to prepare an insulating layer (FIG. 14(c)).

Figure 14D:
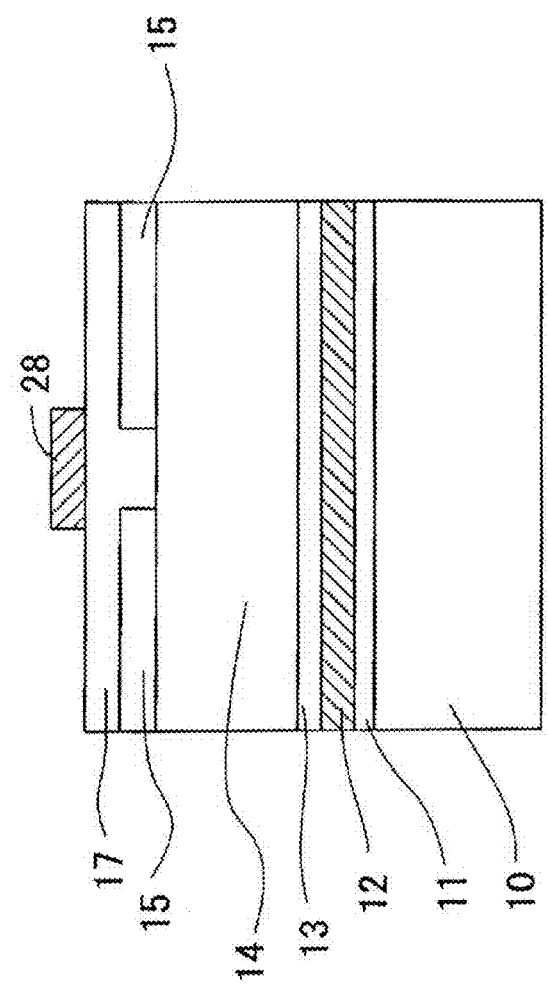

Photoresist is applied on the $SiO_2$ film 17, and a photolithography process by a stepper is conducted to form a mask 28 for etching on the $SiO_2$ film 17 so as to be matched with a planar shape of the region excepting a contact hole for making a connection between the contact layer 15 and the first external electrode 7a, for a formation of such a contact hole (FIG. 14(d)).

Figure 15A:
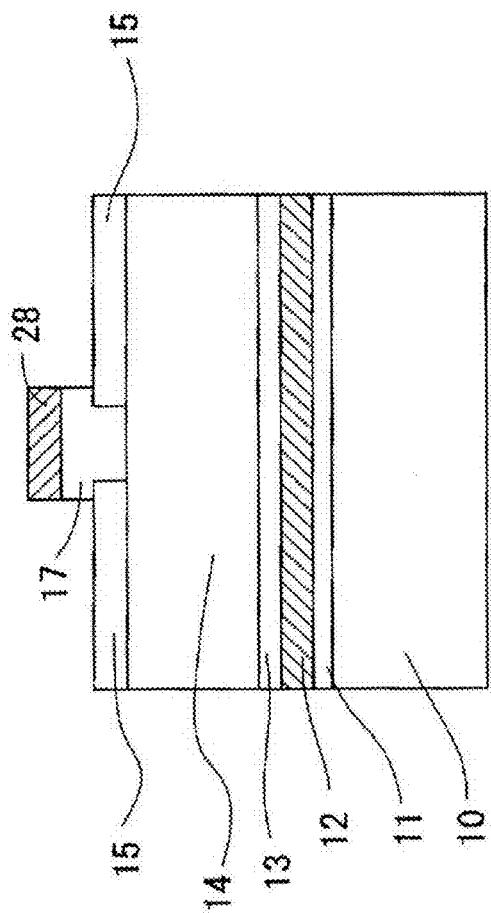
FIG. 15 is a cross-sectional view for describing the subsequent process of the method for manufacturing the semiconductor laser as shown in FIG. 14.

A wet etching process is applied with the use of such a mask 28 to remove partially a portion, which is to be the contact hole on the $SiO_2$ film 17, thus conducting a window-opening in the $SiO_2$ film 17 (FIG. 15(a)).

Figure 15B:
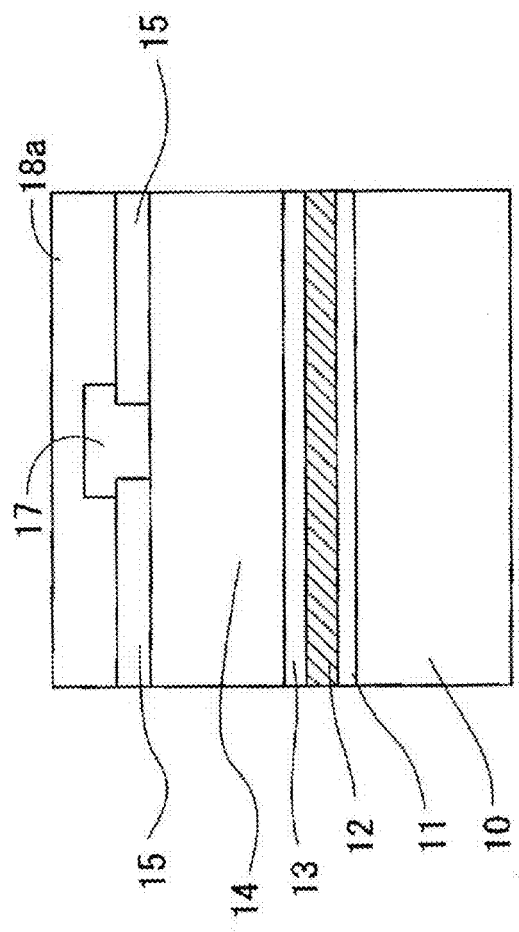

Then, the mask 28 on the $SiO_2$ film 17 is removed by an organic solvent and an ashing process and then an electron beam evaporation process is applied to deposit a metal (Ti/Pt/Au), which is to be the first external electrode 7a for applying a forward bias across the PN connection, within the contact hole and on the $SiO_2$ film 17, to prepare the first TI/Pt/Au layer 18a (FIG. 15(b)).

Then, photoresist is applied on the first TI/Pt/Au layer 18a and a photolithography process by a stepper is conducted to form a mask 29 for etching on the first TI/Pt/Au layer 18a, so as to be matched with a planar shape of the region of the rear small-width waveguide 1 (excepting the boundary between the phase matching region 6a and the waveguide region 6b), the front small-width waveguide 2 and the multi-mode interference optical waveguide 3, as shown in FIG. 10(b) (FIG. 15(c)).

A dry etching in accordance with an ion milling process is applied with the use of such a mask 29 to remove the first TI/Pt/Au layer 18a in the other region (including the boundary between the phase matching region 6a and the waveguide region 6b) than the rear small-width waveguide 1, the front small-width waveguide 2 and the multi-mode interference optical waveguide 3 (FIG. 15(d)), and then to remove the mask 29 on the first TI/Pt/Au layer 18a by an organic solvent and an ashing process, thus forming the first external electrode 7a.

Then, the rear surface of the substrate 10 on which any optical waveguide is not formed, is polished, and the second Ti/Pt/Au layer 18b, which is not shown and to be the second external electrode 7b for applying the forward bias across the PN junction, is formed on the whole of the rear surface of the substrate 10 by then electron beam evaporation process (FIG. 12).

Next, the substrate 10 on which the plurality of semiconductor laser 100 elements are formed, is cleaved along boundaries of the semiconductor laser 100 elements, thus permitting to obtain the semiconductor laser 100 element having the structure as shown in FIG. 10(b) and FIG. 12. Lastly, a low reflection protection film is formed on the front end surface and a high reflection film is formed on the rear end surface, thus terminating the manufacture of the semiconductor laser 100 element.

Now, the description will be given below of the 4×1 multi-mode interference optical waveguide 3 with reference to FIG. 11. The front port 3b of the 4×1 multi-mode interference optical waveguide 3 is eccentrically placed so that a distance between the central line $X_2$ and the central line $X_0$ of the 4×1 multi-mode interference optical waveguide 3 becomes $W_e/6$, as described in the first embodiment of the present invention.

The rear port 3a of the 4×1 multi-mode interference optical waveguide 3 comprises two ports placed on the same side (the facing side) as the front port 3b (the first rear port 101a, the second rear port 102a), and two ports placed on the different side (the opposing corner side) from the front port 3b (the third rear port 103a, the fourth rear port 104a), with reference to the central line $X_0$ of the 4×1 multi-mode interference optical waveguide 3.

The reference line (the first reference line $X_3$), which is placed in an intermediate position between the central line (the first central line $X_{1a}$) of the first rear port 101a and the central line (the second central line $X_{1b}$) of the second rear port 102a, is eccentrically placed by $W_e/6$ from the central line $X_0$ of the 4×1 multi-mode interference optical waveguide 3. The first rear port 101a and the second rear port 102a are placed respectively so that the first central line $X_{1a}$ and the second central line $X_{1b}$ are eccentrically placed by $W_e/(3M)$ (wherein, M=4) relative to the first reference line $X_3$, and the distance between the first central line $X_{1a}$ and the second central line $X_{1b}$ becomes $2W_e/(3M)$ (wherein, M=4).

The reference line (the second reference line $X_4$), which is placed in an intermediate position between the central line (the third central line $X_{1c}$) of the third rear port 103a and the central line (the fourth central line $X_{1d}$) of the fourth rear port 104a, is eccentrically placed by $W_e/6$ from the central line $X_0$ of the 4×1 multi-mode interference optical waveguide 3. The third rear port 103a and the fourth rear port 104a are placed respectively so that the third central line $X_{1c}$ and the fourth central line $X_{1d}$ are eccentrically placed by $W_e/(3M)$ (wherein, M=4) relative to the second reference line $X_4$, and the distance between the third central line $X_{1c}$ and the fourth central line $X_{1d}$ becomes $2W_e/(3M)$ (wherein, M=4).

As for a design example of the 4×1 multi-mode interference optical waveguide 3 according to the embodiment of the present invention, the waveguide width $W_{MMI}$ of the 4×1 multi-mode interference optical waveguide 3 is 15 μm, the waveguide length $L_{MMI}$ of the 4×1 multi-mode interference optical waveguide 3 is 159 μm, and the waveguide widths $W_a$ of the rear small-width waveguide 1 and the front small-width waveguide 2 are 1 μm.

When there was simulated an optical intensity of a fundamental mode light having a main interference light wavelength λ of 1550 nm, in the 4×1 asymmetric MMI 3 in which the waveguide length $L_{MMI}$ was set as one-fourth of the beat length $L_π$, the optical field as shown in FIG. 13(b) was obtained. More specifically, when the waveguide length $L_{MMI}$ of the 4×1 asymmetric MMI 3 is $L_π$ (the beat length)/M (wherein, M=4), as shown in FIG. 13(b), the fundamental mode light forms an image in a single area (the front port 3b) on the end surface on the side of the front port 3b of the asymmetric MMI 3, thus making it possible to enhance the transmittance of the fundamental mode light radiated from the single front port 3b.

The 4×1 multi-mode interference optical waveguide 3 may not oscillate as the semiconductor laser 100, unless there is not made a phase matching of the light (the end phase) incident on the rear port 3a (the first rear port 101a, the second rear port 102a, the third rear port 103a and the fourth rear port 104a) (becoming a large threshold). As a result, the semiconductor laser 100 provided with the 4×1 multi-mode interference optical waveguide 3 enables the rear small-width waveguide 1 to function as the phase matching waveguide so as to shift the phase of the light incident on the first rear port 101a by π/4 [rad] and shift the phase of the light incident on the fourth rear port 104a by −π/4 [rad], relative to the phase of the light incident on the second rear port 102a and the third rear port 103a (0 [rad]).

There is an example of the phase matching waveguide that matches the phase of the light incident on the first rear port 101a, the second rear port 102a, the third rear port 103a and the fourth rear port 104a by designing the rear small-width waveguide 1 connected to the second rear port 102a and the third rear port 103a (the second rear small-width waveguide 1b, the third rear small-width waveguide 1c) as a linear waveguide, and designing the rear small-width waveguide 1 (the first rear small-width waveguide 1a) connected to the first rear port 101a and the rear small-width waveguide 1 (the fourth rear small-width waveguide 1d) connected to the fourth rear port 104a as a curved waveguide having a curved section, as shown in FIG. 11(a).

There is another example of the phase matching waveguide that matches the phase of the light incident on the first rear port 101a, the second rear port 102a, the third rear port 103a and the fourth rear port 104a by removing a part of the contact layer 15 so as to traverse the longitudinal direction of the rear small-width waveguide 1 to divide the rear small-width waveguide 1 into two regions (a phase matching region 6a, and a waveguide region 6b), as shown in FIG. 11(b) and FIG. 12(c), and injecting different currents to the phase matching region 6a and the waveguide region 6b to vary a refraction index of a light emitting layer 12.

Fourth Embodiment of the Present Invention

Figure 16A:
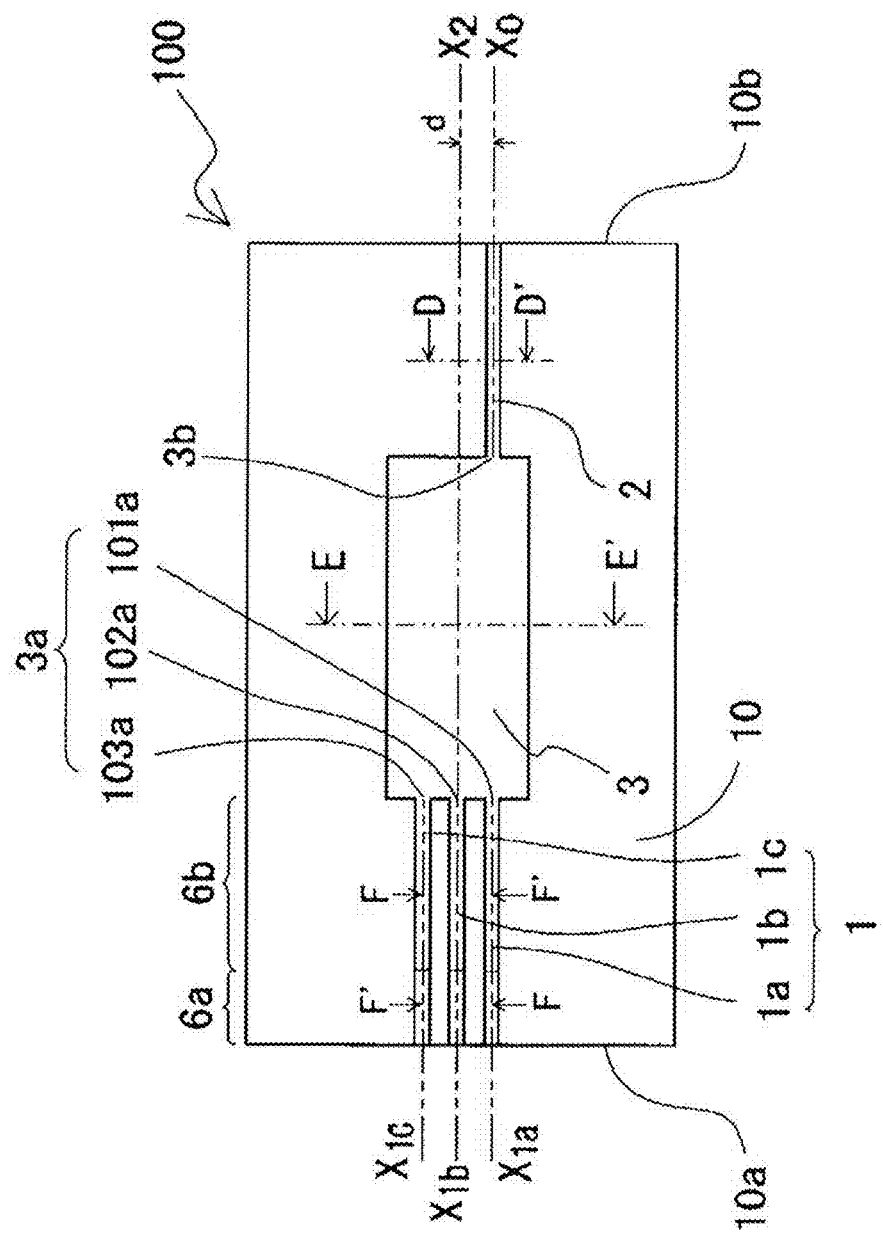
FIG. 16 (a) is a plan view illustrating an example of a schematic structure of the semiconductor laser provided with a 3×1 multi-mode interference optical waveguide according to the fourth embodiment of the present invention, and (b) is a plan view illustrating an example of a schematic structure of the semiconductor laser provided with a 4×1 multi-mode interference optical waveguide according to the fourth embodiment of the present invention.
Figure 16B:
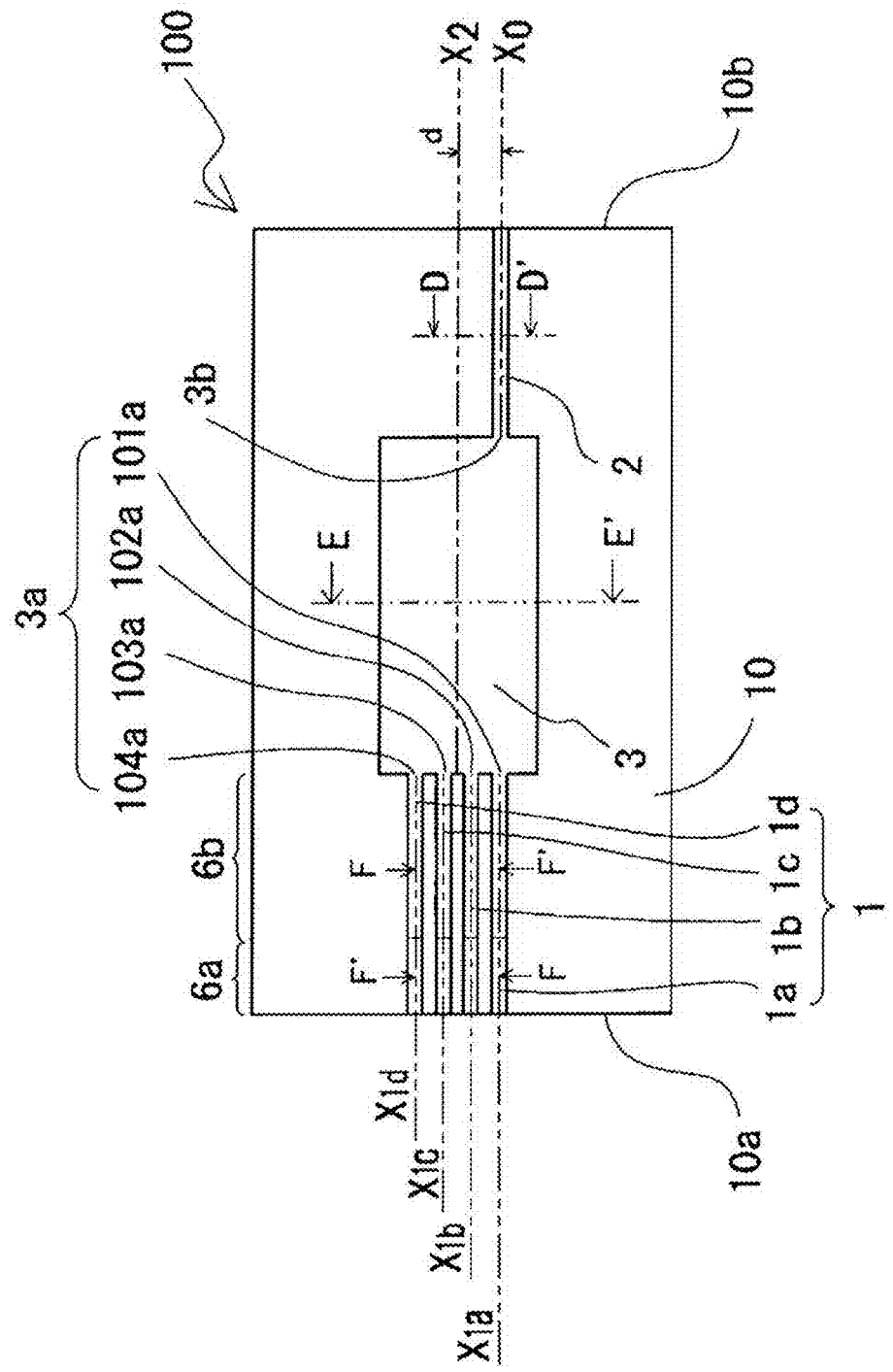
Figure 17A:
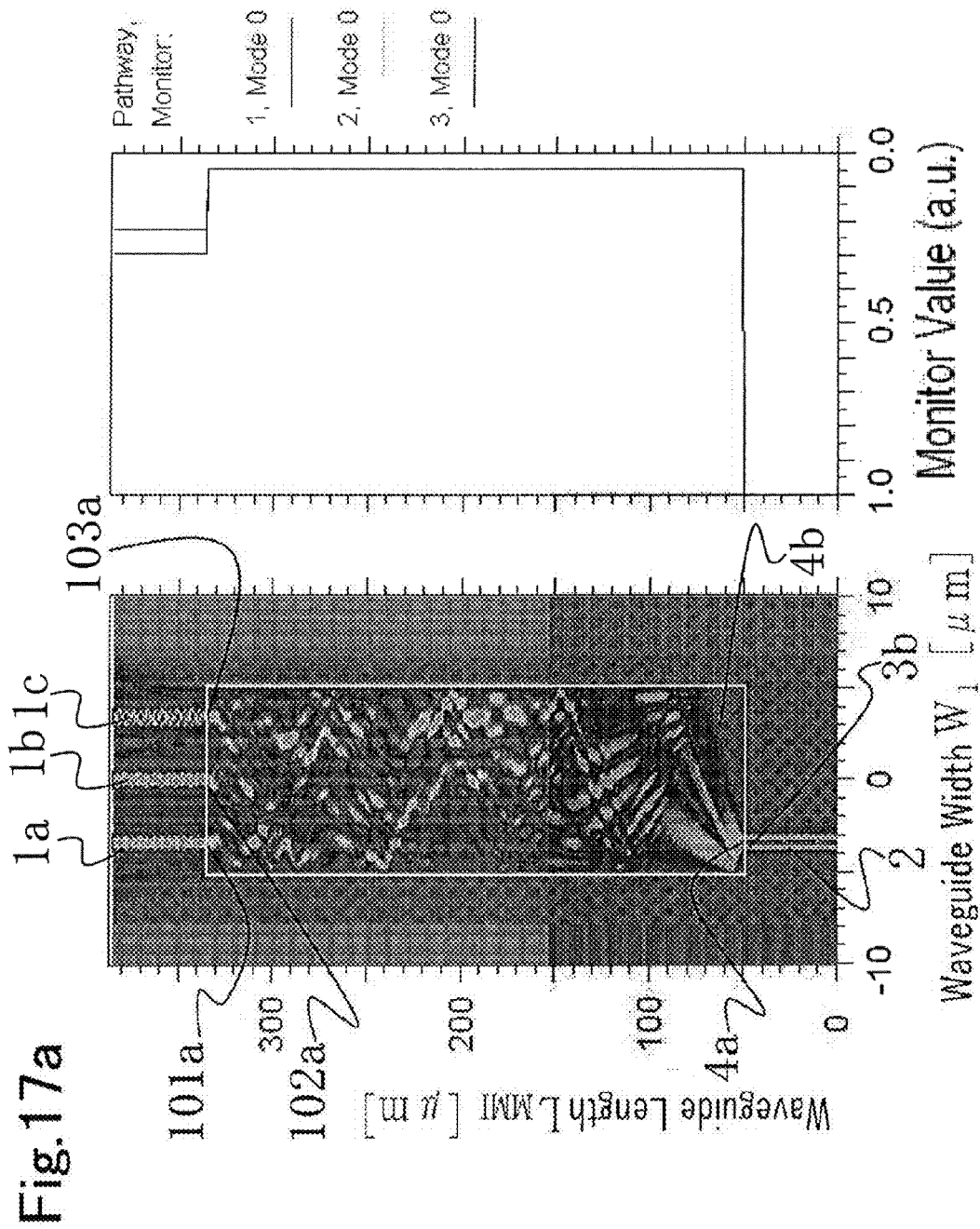
FIG. 17 (a) is a descriptive view illustrating an optical field in which an optical intensity of a fundamental mode light having a main interference light wavelength λ of 1550 nm is simulated, in case where the waveguide length of the 3×1 multi-mode interference optical waveguide as shown in FIG. 16(a) is coincident with a beat length, and (b) is a descriptive view illustrating an optical field in which an optical intensity of a fundamental mode light having a main interference light wavelength λ of 1550 nm is simulated, in case where the waveguide length of the 4×1 multi-mode interference optical waveguide as shown in FIG. 16(b) is set as three-fourth of the beat length.

FIG. 16(a) is a plan view illustrating an example of a schematic structure of the semiconductor laser provided with a 3×1 multi-mode interference optical waveguide according to the fourth embodiment of the present invention, and FIG. 16(b) is a plan view illustrating an example of a schematic structure of the semiconductor laser provided with a 4×1 multi-mode interference optical waveguide according to the fourth embodiment of the present invention. FIG. 17(a) is a descriptive view illustrating an optical field in which an optical intensity of a fundamental mode light having a main interference light wavelength λ of 1550 nm is simulated, in case where the waveguide length of the 3×1 multi-mode interference optical waveguide as shown in FIG. 16(a) is coincident with a beat length, and FIG. 17(b) is a descriptive view illustrating an optical field in which an optical intensity of a fundamental mode light having a main interference light wavelength λ of 1550 nm is simulated, in case where the waveguide length of the 4×1 multi-mode interference optical waveguide as shown in FIG. 16(b) is set as three-fourth of the beat length. The same reference numerals in FIG. 16 and FIG. 17 as those used in FIGS. 1 to 15 show the same or corresponding components and the description of them will be omitted.

The 3×1 multi-mode interference optical waveguide 3 and the 4×1 multi-mode interference optical waveguide 3 according to the above-described third embodiment of the present invention have been described as the respective central lines of the rear port 3a being placed asymmetrically (unevenly) with reference to the central line $X_0$ of the multi-mode interference optical waveguide 3. However, the respective central lines of the rear port 3a may be placed symmetrically (evenly) with reference to the central line $X_0$ of the multi-mode interference optical waveguide 3, as shown in FIG. 16.

Now, the 3×1 multi-mode interference optical waveguide 3 will be described below with reference to FIG. 16(a). The front port 3b of the 3×1 multi-mode interference optical waveguide 3 is eccentrically placed so that the distance between the central line $X_2$ and the central line $X_0$ of the 3×1 multi-mode interference optical waveguide 3 becomes $W_e/3$.

The rear port 3a of the 3×1 multi-mode interference optical waveguide 3 comprises the second rear port 102a, which has the central line (the second central line $X_{1b}$) coincident with the central line $X_0$ of the 3×1 multi-mode interference optical waveguide 3, the first rear port 101a, which has the central lines (the first central line $X_{1a}$ and the third central line $X_{1c}$) as placed at the same intervals with reference to the central line $X_0$ of the 3×1 multi-mode interference optical waveguide 3 and placed on the same (opposing) side as the front port 3b, and the third rear port 103a as placed on the different (opposing corner) side from the front port 3b. The first rear port 101a and the third rear port 103a are provided so that the first central line $X_{1a}$ and the third central line $X_{1c}$ are eccentrically placed by $W_e/3$ relative to the central line $X_0$ of the 3×1 multi-mode interference optical waveguide 3. Especially, the first central line $X_{1a}$ of the first rear port 101a is coincident with the central line $X_2$ of the front port 3b.

Here, the number of 4 corresponding to the 1×1 multi-mode interference optical waveguide 3 as described in the first embodiment of the present invention may be expanded by the following Equation (7) so as to correspond to the M×1 multi-mode interference optical waveguide 3 in which a plurality of rear ports 3a are placed symmetrically (evenly).

$$L_{MMI}=3\times L_π/M \text{ (M being a positive integer)} \qquad \text{Equation (7)}$$

As for a design example of the 3×1 multi-mode interference optical waveguide 3 according to the embodiment of the present invention, the waveguide width $W_{MMI}$ of the 3×1 multi-mode interference optical waveguide 3 is 10 μm, the effective waveguide width $W_e$ of the 3×1 multi-mode interference optical waveguide 3 is about 10.2 μm, the waveguide length $L_{MMI}$ of the 3×1 multi-mode interference optical waveguide 3 is about 285 μm, and the waveguide widths $W_a$ of the rear small-width waveguide 1 and the front small-width waveguide 2 are 1 μm.

When there was simulated an optical intensity of a fundamental mode light having a main interference light wavelength λ of 1550 nm, in the 3×1 asymmetric MMI 3 in which the waveguide length $L_{MMI}$ was in coincident with the beat length $L_\pi$ (set as three-third of the beat length $L_\pi$), the optical field as shown in FIG. 17(a) was obtained. More specifically, when the waveguide length $L_{MMI}$ of the 3×1 asymmetric MMI 3 is $3×L_\pi$ (the beat length)/M (wherein, M=3), as shown in FIG. 17(a), the fundamental mode light forms an image in a single area (the front port 3b) on the end surface on the side of the front port 3b of the asymmetric MMI 3, thus making it possible to enhance the transmittance of the fundamental mode light radiated from the single front port 3b.

The semiconductor laser 100 provided with the 3×1 multi-mode interference optical waveguide 3 enables the rear small-width waveguide 1 to function as the phase matching waveguide so as to shift the phase of the light incident on the second rear port 102a by $\pi/3$ [rad] and shift the phase of the light incident on the third rear port 103a by $2\pi/3$ [rad], relative to the phase of the light incident on the second rear port 101a (0 [rad]).

As for the phase matching waveguide, the first rear small-width waveguide 1a may be designed as a linear waveguide, and the second rear small-width waveguide 1b and the third rear small-width waveguide 1c may be designed as a curved waveguide having a curved section so as to make a phase matching of the lights incident on the first rear port 101a, the second rear port 102a and the third rear port 103a, although illustration is omitted.

Then, the 4×1 multi-mode interference optical waveguide 3 will be described below with reference to FIG. 16(b). The front port 3b of the 4×1 multi-mode interference optical waveguide 3 is eccentrically placed so that the distance between the central line $X_2$ and the central line $X_0$ of the 4×1 multi-mode interference optical waveguide 3 becomes $3W_e/8$.

The rear port 3a of the 4×1 multi-mode interference optical waveguide 3 comprises two ports (the first rear port 101a, the second rear port 102a), which are placed on the same (opposing) side as the front port 3b with reference to the central line $X_0$ of the 4×1 multi-mode interference optical waveguide 3, and two ports (the third rear port 103a, the fourth rear port 104a), which are placed on the different (opposing corner) side from the front port 3a.

The second rear port 102a and the third rear port 103a are provided so that the second central line $X_{1b}$ and the third central line $X_{1c}$ are eccentrically placed by $W_e/8$ relative to the central line $X_0$ of the 4×1 multi-mode interference optical waveguide 3.

The first rear port 101a and the fourth rear port 104a are provided so that the first central line $X_{1a}$ and the fourth central line $X_{1d}$ are eccentrically placed by $3W_e/8$ relative to the central line $X_0$ of the 4×1 multi-mode interference optical waveguide 3. Especially, the first central line $X_{1a}$ of the first rear port 101a is coincident with the central line $X_2$ of the front port 3b.

As for a design example of the 4×1 multi-mode interference optical waveguide 3 according to the embodiment of the present invention, the waveguide width $W_{MMI}$ of the 4×1 multi-mode interference optical waveguide 3 is 10 μm, the effective waveguide width $W_e$ of the 4×1 multi-mode interference optical waveguide 3 is about 10.2 μm, the waveguide length $L_{MMI}$ of the 4×1 multi-mode interference optical waveguide 3 is about 214 μm, and the waveguide widths $W_a$ of the rear small-width waveguide 1 and the front small-width waveguide 2 are 1 μm.

When there was simulated an optical intensity of a fundamental mode light having a main interference light wavelength λ of 1550 nm, in the 4×1 asymmetric MMI 3 in which the waveguide length $L_{MMI}$ was set as three-fourth of the beat length $L_\pi$), the optical field as shown in FIG. 17(b) was obtained. More specifically, when the waveguide length $L_{MMI}$ of the 4×1 asymmetric MMI 3 is $3×L_\pi$ (the beat length)/M (wherein, M=4), as shown in FIG. 17(b), the fundamental mode light forms an image in a single area (the front port 3b) on the end surface on the side of the front port 3b of the asymmetric MMI 3, thus making it possible to enhance the transmittance of the fundamental mode light radiated from the single front port 3b.

The semiconductor laser 100 provided with the 4×1 multi-mode interference optical waveguide 3 enables the rear small-width waveguide 1 to function as the phase matching waveguide so as to shift the phase of the light incident on the second rear port 102a by $5\pi/4$ [rad] and shift the phase of the light incident on the third rear port 103a by $\pi/4$ [rad], relative to the phase of the light incident on the first rear port 101a and the fourth rear port 104a (0 [rad]).

As for the phase matching waveguide, the first rear small-width waveguide 1a and the fourth rear small-width waveguide 1d may be designed as a linear waveguide, and the second rear small-width waveguide 1b and the third rear small-width waveguide 1c may be designed as a curved waveguide having a curved section so as to make a phase matching of the lights incident on the first rear port 101a, the second rear port 102a, the third rear port 103a and the fourth rear port 104a, although illustration is omitted.

In the 3×1 multi-mode interference optical waveguide 3 and the 4×1 multi-mode interference optical waveguide 3 according to the third embodiment and the fourth embodiment of the present invention, the light absorption unit 5 may be provided in the non-imaging region 4b, in the same manner as the second embodiment as described above of the present invention.

In this case, the light absorption unit 5 is provided in a planar shape, which may be accommodated in a region of the above-mentioned non-imaging region 4b, so as to correspond to the non-imaging region 4b placed in the vicinity of the front port 3b of the multi-mode interference optical waveguide 3, based on the optical field as shown in FIG. 13(a) or FIG. 17(a) in the 3×1 multi-mode interference optical waveguide 3, or based on the optical field as shown in FIG. 13(b) or FIG. 17(b) in the 4×1 multi-mode interference optical waveguide 3.

The place at which the light absorption unit 5 is to be provided, is not limited only to the non-imaging region 4b placed in the vicinity of the front port 3b of the multi-mode interference optical waveguide 3, provided that it is a place where an effective light absorption unit 5 may be formed and is located in the non-imaging region 4b.

In the M×1 multi-mode interference optical waveguide 3 according to the embodiment of the present invention, in which a plurality of rear ports 3a are placed symmetrically (evenly), the waveguide length $L_{MMI}$ becomes threefold, as is clear from Equation (7) indicated above, in comparison with the waveguide length $L_{MMI}$ of the M×1 multi-mode interference optical waveguide 3 in which a plurality of rear ports 3a are placed asymmetrically (unevenly). It is therefore preferable to design, as the semiconductor laser 100, the M×1 multi-mode interference optical waveguide 3 in which a plurality of rear ports 3a are placed asymmetrically (unevenly), in order to achieve miniaturization of the element.

DESCRIPTION OF REFERENCE NUMERALS 1 rear small-width waveguide
1a first rear small-width waveguide
1b second rear small-width waveguide
1c third rear small-width waveguide
1d fourth rear small-width waveguide
2 front small-width waveguide 3 M×N multi-mode interference optical waveguide, 1×1 multi-mode interference optical waveguide
3a rear port
3b front port
4 imaginary face
4a imaging point
4b non-imaging region
5 light absorption unit
5a recess
5b electric isolation groove
6a phase matching region
6b waveguide region
10 substrate, substrate layer
10a one end surface
10b the other end surface
10c bottom surface by etching
11 buffer layer
12 light emitting layer
13 first clad layer
14 second clad layer
15 contact layer
16 embedded layer
21 n-InP film
22 InGaAsP/InGaAsP-1.55 μm film
23 i-InP film
24 p-InP film
25 p-InGaAs film
26 mask
100 semiconductor laser
101a first rear port
102a second rear port
103a third rear port
104a fourth rear port

What is claimed is:

1. A semiconductor laser, which comprising: a single front port and a single or a plurality of rear ports provided, and a multi-mode interference optical waveguide having an active layer in an entire area thereof in an planar view,
wherein:
said front port is eccentrically provided relative to a central line along a waveguide direction of said multi-mode interference optical waveguide in the planar view so as to correspond to an imaging point at which a fundamental mode light forms an image in said active layer, which is perpendicular to the waveguide direction of said multi-mode interference optical waveguide.

2. The semiconductor laser as claimed in claim 1, wherein: an amount of eccentricity of a central line of said front port relative to the central line of said multi-mode interference optical waveguide is within ±0.3 μm as a reference of one-sixth of an effective waveguide width of said multi-mode interference optical waveguide.

3. The semiconductor laser as claimed in claim 1, wherein:
a layer structure of said multi-mode interference optical waveguide is a high-mesa structure.

4. The semiconductor laser as claimed in claim 2, wherein: a layer structure of said multi-mode interference optical waveguide is a high-mesa structure.

5. The semiconductor laser as claimed in claim 1, wherein: said rear port is eccentrically provided relative to the central line along a waveguide direction of said multi-mode interference optical waveguide in the planar view and eccentrically provided relative to the central line of said front port in the planar view.

6. The semiconductor laser as claimed in claim 2, wherein: said rear port is eccentrically provided relative to the central line along a waveguide direction of said multi-mode interference optical waveguide in the planar view and eccentrically provided relative to the central line of said front port in the planar view.

7. The semiconductor laser as claimed in claim 3, wherein: said rear port is eccentrically provided relative to the central line along a waveguide direction of said multi-mode interference optical waveguide in the planar view and eccentrically provided relative to the central line of said front port in the planar view.

8. The semiconductor laser as claimed in claim 4, wherein: said rear port is eccentrically provided relative to the central line along a waveguide direction of said multi-mode interference optical waveguide in the planar view and eccentrically provided relative to the central line of said front port in the planar view.

9. The semiconductor laser as claimed in claim 1, further comprising a small-width optical waveguide, which is respectively connected to said front port and said rear port, and
wherein, said small-width optical waveguide is a single-mode waveguide, which blocks a high-order mode light.

10. The semiconductor laser as claimed in claim 2, further comprising a small-width optical waveguide, which is respectively connected to said front port and said rear port, and
wherein, said small-width optical waveguide is a single-mode waveguide, which blocks a high-order mode light.

11. The semiconductor laser as claimed in claim 3, further comprising a small-width optical waveguide, which is respectively connected to said front port and said rear port, and
wherein, said small-width optical waveguide is a single-mode waveguide, which blocks a high-order mode light.

12. The semiconductor laser as claimed in claim 4, further comprising a small-width optical waveguide, which is respectively connected to said front port and said rear port, and
wherein, said small-width optical waveguide is a single-mode waveguide, which blocks a high-order mode light.

13. The semiconductor laser as claimed in claim 5, further comprising a small-width optical waveguide, which is respectively connected to said front port and said rear port, and
wherein, said small-width optical waveguide is a single-mode waveguide, which blocks a high-order mode light.

14. The semiconductor laser as claimed in claim 6, further comprising a small-width optical waveguide, which is respectively connected to said front port and said rear port, and
wherein, said small-width optical waveguide is a single-mode waveguide, which blocks a high-order mode light.

15. The semiconductor laser as claimed in claim 7, further comprising a small-width optical waveguide, which is respectively connected to said front port and said rear port, and
wherein, said small-width optical waveguide is a single-mode waveguide, which blocks a high-order mode light.

16. The semiconductor laser as claimed in claim 8, further comprising a small-width optical waveguide, which is respectively connected to said front port and said rear port, and
wherein, said small-width optical waveguide is a single-mode waveguide, which blocks a high-order mode light.

17. The semiconductor laser as claimed in claim 1, further comprising a light absorption unit, which absorbs a high-order mode light, in a non-imaging region excepting the imaging point in an imaginary face including said imaging point at which the fundamental mode light forms the image in said active layer, which is perpendicular to the waveguide direction of said multi-mode interference optical waveguide.

18. The semiconductor laser as claimed in claim 2, further comprising a light absorption unit, which absorbs a high-order mode light, in a non-imaging region excepting the imaging point in an imaginary face including said imaging point at which the fundamental mode light forms the image in said active layer, which is perpendicular to the waveguide direction of said multi-mode interference optical waveguide.

19. The semiconductor laser as claimed in claim 5, further comprising a light absorption unit, which absorbs a high-order mode light, in a non-imaging region excepting the imaging point in an imaginary face including said imaging point at which the fundamental mode light forms the image in said active layer, which is perpendicular to the waveguide direction of said multi-mode interference optical waveguide.

20. The semiconductor laser as claimed in claim 6, further comprising a light absorption unit, which absorbs a high-order mode light, in a non-imaging region excepting the imaging point in an imaginary face including said imaging point at which the fundamental mode light forms the image in said active layer, which is perpendicular to the waveguide direction of said multi-mode interference optical waveguide.

21. The semiconductor laser as claimed in claim 9, further comprising a light absorption unit, which absorbs a high-order mode light, in a non-imaging region excepting the imaging point in an imaginary face including said imaging point at which the fundamental mode light forms the image in said active layer, which is perpendicular to the waveguide direction of said multi-mode interference optical waveguide.

22. The semiconductor laser as claimed in claim 10, further comprising a light absorption unit, which absorbs a high-order mode light, in a non-imaging region excepting the imaging point in an imaginary face including said imaging point at which the fundamental mode light forms the image in said active layer, which is perpendicular to the waveguide direction of said multi-mode interference optical waveguide.

\* \* \* \* \*